(12) United States Patent
Negley et al.

(10) Patent No.: US 9,391,118 B2
(45) Date of Patent: Jul. 12, 2016

(54) FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS

(75) Inventors: Gerald H. Negley, Durham, NC (US); Antony Paul Van De Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 1247 days.

(21) Appl. No.: 12/017,558

(22) Filed: Jan. 22, 2008

(65) Prior Publication Data
US 2008/0179602 A1  Jul. 31, 2008

Related U.S. Application Data

(60) Provisional application No. 60/885,937, filed on Jan. 22, 2007, provisional application No. 60/982,892, filed on Oct. 26, 2007, provisional application No. 60/986,662, filed on Nov. 9, 2007.

(51) Int. Cl.
*H01L 33/00* (2010.01)
*H01L 21/02* (2006.01)
*H01L 27/15* (2006.01)
(Continued)

(52) U.S. Cl.
CPC .......... *H01L 27/156* (2013.01); *H01L 21/2654* (2013.01); *H01L 33/62* (2013.01); *H01L 2924/0002* (2013.01)

(58) Field of Classification Search
CPC ..... H01L 33/62; H01L 25/0753; H01L 33/00; H01L 21/02

USPC ....................................................... 257/88, 93
See application file for complete search history.

(56) References Cited

U.S. PATENT DOCUMENTS 4,329,625 A * 5/1982 Nishizawa et al. ........... 315/158
4,396,929 A   8/1983 Ohki et al.
4,476,620 A   10/1984 Ohki et al.
(Continued)

FOREIGN PATENT DOCUMENTS

CN  1596560  3/2005
CN  1679177  10/2005
(Continued)

OTHER PUBLICATIONS

"OSRAM Enhances Brightness of Blue InGaN LEDs," Compound Semiconductor, vol. 7, No. 1, Feb. 2001.
(Continued)

*Primary Examiner* — Sheng Zhu
(74) *Attorney, Agent, or Firm* — Burr & Brown, PLLC

(57) ABSTRACT

There is provided a light emitter comprising light emitting devices (for example, light emitting diodes) which are electrically interconnected to provide an array of at least two serially connected subsets of parallel connected light emitting devices, each subset comprising at least three light emitting devices. In some embodiments, the light emitting devices are from a contiguous region of a wafer. There is also provided a light emitter, comprising light emitting devices, means for mechanically interconnecting the light emitting devices and means for electrically interconnecting the light emitting devices to provide serially connected subsets interconnected in parallel, each subset comprising at least three light emitting devices. Also, methods of fabricating light emitters.

3 Claims, 17 Drawing Sheets

(51) Int. Cl.
*H01L 21/265* (2006.01)
*H01L 33/62* (2010.01)

(56) References Cited

U.S. PATENT DOCUMENTS

| | | | |
|---|---|---|---|
| 4,675,575 A | 6/1987 | Smith et al. | |
| 4,966,862 A | 10/1990 | Edmond | |
| 5,006,908 A | 4/1991 | Matsuoka et al. | |
| 5,087,949 A | 2/1992 | Haitz | |
| 5,187,547 A | 2/1993 | Niina et al. | |
| 5,210,051 A | 5/1993 | Carter et al. | |
| 5,247,533 A | 9/1993 | Okazaki et al. | |
| 5,266,125 A | 11/1993 | Rand et al. | |
| 5,330,918 A | 7/1994 | Dubbelday et al. | |
| 5,393,993 A | 2/1995 | Edmond et al. | |
| 5,416,342 A | 5/1995 | Edmond et al. | |
| 5,446,440 A * | 8/1995 | Gleason et al. | 340/331 |
| 5,523,589 A | 6/1996 | Edmond et al. | |
| 5,639,314 A | 6/1997 | Kura et al. | |
| 5,718,760 A | 2/1998 | Carter et al. | |
| 5,767,581 A | 6/1998 | Nakamura et al. | |
| 5,779,924 A | 7/1998 | Krames et al. | |
| 5,912,477 A | 6/1999 | Negley | |
| 5,917,202 A | 6/1999 | Haitz et al. | |
| 5,952,681 A | 9/1999 | Chen | |
| 6,033,927 A * | 3/2000 | Shibata et al. | 438/33 |
| 6,046,465 A | 4/2000 | Wang et al. | |
| 6,072,280 A | 6/2000 | Allen | |
| 6,091,085 A | 7/2000 | Lester | |
| 6,097,041 A | 8/2000 | Lin et al. | |
| 6,121,636 A | 9/2000 | Moria et al. | |
| 6,121,637 A | 9/2000 | Isokawa et al. | |
| 6,133,589 A | 10/2000 | Krames et al. | |
| 6,150,771 A | 11/2000 | Perry | |
| 6,153,985 A | 11/2000 | Grossman | |
| 6,169,294 B1 | 1/2001 | Biing-Jye et al. | |
| 6,177,688 B1 | 1/2001 | Linthicum et al. | |
| 6,187,615 B1 | 2/2001 | Kim et al. | |
| 6,194,743 B1 | 2/2001 | Kondoh et al. | |
| 6,194,839 B1 | 2/2001 | Chang | |
| 6,201,353 B1 | 3/2001 | Chang et al. | |
| 6,222,207 B1 | 4/2001 | Carter-Coman et al. | |
| 6,229,160 B1 | 5/2001 | Krames et al. | |
| 6,249,088 B1 | 6/2001 | Chang | |
| 6,288,497 B1 | 9/2001 | Chang et al. | |
| 6,362,578 B1 | 3/2002 | Swanson et al. | |
| 6,388,393 B1 | 5/2002 | Illingworth | |
| 6,410,942 B1 | 6/2002 | Thibeault et al. | |
| 6,459,100 B1 | 10/2002 | Doverspike et al. | |
| 6,461,019 B1 | 10/2002 | Allen | |
| 6,466,188 B1 * | 10/2002 | Cato | 345/82 |
| 6,525,513 B1 * | 2/2003 | Zhao | 323/222 |
| 6,547,249 B2 | 4/2003 | Collins, III et al. | |
| 6,577,512 B2 | 6/2003 | Tripathi et al. | |
| 6,635,503 B2 | 10/2003 | Andrews et al. | |
| 6,784,463 B2 | 8/2004 | Camras et al. | |
| 6,808,287 B2 | 10/2004 | Lebens et al. | |
| 6,830,940 B1 * | 12/2004 | Wasserbauer et al. | 438/14 |
| 6,836,081 B2 | 12/2004 | Swanson et al. | |
| 6,885,035 B2 | 4/2005 | Bhat et al. | |
| 7,009,199 B2 | 3/2006 | Hall | |
| 7,186,000 B2 | 3/2007 | Lebens et al. | |
| 7,213,940 B1 | 5/2007 | Van De Ven et al. | |
| 7,213,942 B2 | 5/2007 | Jiang et al. | |
| 7,221,044 B2 | 5/2007 | Fan et al. | |
| 7,259,403 B2 | 8/2007 | Shimizu et al. | |
| 7,417,259 B2 | 8/2008 | Sakai et al. | |
| 7,473,934 B2 | 1/2009 | Nagai et al. | |
| 7,524,085 B2 | 4/2009 | Bedson et al. | |
| 7,821,023 B2 | 10/2010 | Yuan et al. | |
| 2002/0015013 A1 | 2/2002 | Ragle | |
| 2002/0139987 A1 * | 10/2002 | Collins et al. | 257/88 |
| 2003/0042908 A1 | 3/2003 | St-Germain | |
| 2003/0042914 A1 | 3/2003 | St-Germain | |
| 2003/0045015 A1 | 3/2003 | Slater, Jr. et al. | |
| 2003/0067302 A1 | 4/2003 | St-Germain | |
| 2003/0089918 A1 | 5/2003 | Hiller et al. | |
| 2003/0178627 A1 * | 9/2003 | Marchl et al. | 257/80 |
| 2003/0189829 A1 * | 10/2003 | Shimizu et al. | 362/240 |
| 2003/0209997 A1 | 11/2003 | St-Germain et al. | |
| 2005/0017256 A1 | 1/2005 | Slater, Jr. et al. | |
| 2005/0077838 A1 | 4/2005 | Blumel | |
| 2005/0174064 A1 * | 8/2005 | Agostinelli et al. | 315/169.3 |
| 2005/0225973 A1 * | 10/2005 | Eliashevich et al. | 362/217 |
| 2005/0253151 A1 | 11/2005 | Sakai et al. | |
| 2006/0044864 A1 | 3/2006 | Lin et al. | |
| 2006/0113548 A1 | 6/2006 | Chen et al. | |
| 2006/0163589 A1 | 7/2006 | Fan et al. | |
| 2006/0171135 A1 | 8/2006 | Ishizaka et al. | |
| 2006/0180818 A1 | 8/2006 | Nagai et al. | |
| 2007/0065960 A1 | 3/2007 | Fukshima et al. | |
| 2007/0138500 A1 | 6/2007 | Sakai et al. | |
| 2007/0202623 A1 | 8/2007 | Gao et al. | |
| 2007/0223219 A1 | 9/2007 | Medendorp, Jr. et al. | |
| 2007/0241360 A1 | 10/2007 | Slater, Jr. et al. | |
| 2007/0284598 A1 | 12/2007 | Shakuda et al. | |
| 2008/0017871 A1 | 1/2008 | Lee et al. | |
| 2008/0083929 A1 | 4/2008 | Fan et al. | |
| 2010/0155746 A1 | 6/2010 | Ibbetson et al. | |
| 2010/0252840 A1 | 10/2010 | Ibbetson et al. | |
| 2011/0084294 A1 | 4/2011 | Yao | |

FOREIGN PATENT DOCUMENTS

| | | |
|---|---|---|
| EP | 0 961 328 | 12/1999 |
| EP | 1 553 641 A1 | 7/2005 |
| EP | 1553641 | 7/2005 |
| EP | 1 566 848 | 8/2005 |
| GB | 1 418 473 | 12/1975 |
| GB | 2 346 480 | 8/2000 |
| JP | 56-131977 | 10/1981 |
| JP | 01-225377 | 9/1989 |
| JP | 09-082587 | 3/1997 |
| JP | 10-256604 | 9/1998 |
| JP | 2000-101136 | 4/2000 |
| JP | 2000-195827 | 7/2000 |
| JP | 2001-156331 | 6/2001 |
| JP | 2001-307506 | 11/2001 |
| JP | 2004-006582 | 1/2004 |
| JP | 2004-014899 | 1/2004 |
| JP | 2005-235779 | 9/2005 |
| JP | 2006-222412 | 8/2006 |
| JP | 2006-303525 | 11/2006 |
| KR | 10-2005-0052474 | 6/2005 |
| WO | 03047314 | 6/2003 |
| WO | 2005/048361 A2 | 5/2005 |
| WO | 2006/025497 | 3/2006 |
| WO | WO 2006/061728 | 6/2006 |
| WO | 2007/001116 A1 | 1/2007 |

OTHER PUBLICATIONS

Biederman, "The Optical Absorption Bands and Their Anisotropy in the Various Modifications of SiC," Solid State Communications, Vo. 3, 1965, pp. 343-346.

Craford, "Outlook for AllnGaP Technology," Presentation, Strategies in Light 2000.

Craford, "Overview of Device Issues in High-Brightness Light-Emitting Diodes," Chapter, *High Brightness Light Emitting Diodes: Semiconductors and Semimetals*, vol. 48, Stringfellow et al. ed., Academic Press, 1997, pp. 47-63.

Krames et al., "High-Power Truncated-Inverted-Pyramid (Al$_x$Ga$_{1-x}$)$_{0.5}$In$_{0.5}$P/GaP Light-Emitting Diodes Exhibiting >50% External Quantum Efficiency," Applied Physics Letters, vol. 75, No. 16, Oct. 18, 1999, pp. 2365-2367.

Lambrecht et al., "Band Structure Interpretation of the Optical Transitions Between Low-Lying Conduction Bands in n-Type Doped SiC Polytypes," Materials Science Forum, vols. 264-268, 1998, pp. 271-274.

Yoo et al., "Bulk Crystal Growth of 6H—SiC on Polytype-Controlled Substrates Through Vapor Phase and Characterization," Journal of Crystal Growth, Vo. 115, vol. 1991, pp. 733-739.

(56) References Cited

OTHER PUBLICATIONS

U.S. Appl. No. 11/854,744, filed Sep. 13, 2007.
U.S. Appl. No. 11/936,163, filed Nov. 7, 2007.
U.S. Appl. No. 11/948,021, filed Nov. 30, 2007.
U.S. Appl. No. 12/017,600, filed Jan. 22, 2008.
U.S. Appl. No. 12/017,676, filed Jan. 22, 2008.
Kanamori, "High-Power White LEDs Based on a Multiple Small Chip Structure," First International Conference on White LEDs and Solid State Lighting.
Ng et al., "Light Emitting Diodes with Variable Spectral Output," First International Conference on White LEDs and Solid State Lighting.
Jin et al., "InGaN/GaN quantum well interconnected microdisk light emitting diodes".
Spitzer et al., "Multijunction AC or DC Integrated GaP Light Emitting Diode Array".
Japanese Office Action from a corresponding Japanese patent application bearing a mailing date of Mar. 6, 2012.
Japanese Office Action from a corresponding Japanese patent application bearing a mailing date of Mar. 7, 2014.
Taiwan Office Action from a corresponding Taiwan patent application bearing a mailing date of Aug. 26, 2013.
Korean Office Action from a corresponding Korean patent application bearing a mailing date of Feb. 12, 2014.
Miyachi et al., "Development of Light Sources by Large-Scale Integrated Light-Emitting Diodes", First International Conference on White LEDs and Solid State Lighting, 4 pages.

* cited by examiner

FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS

CROSS-REFERENCE TO RELATED APPLICATIONS

This application claims the benefit of U.S. Provisional Patent Application No. 60/885,937, filed Jan. 22, 2007, the entirety of which is incorporated herein by reference.

This application claims the benefit of U.S. Provisional Patent Application No. 60/982,892, filed Oct. 26, 2007, the entirety of which is incorporated herein by reference.

This application claims the benefit of U.S. Provisional Patent Application No. 60/986,662, filed Nov. 9, 2007, the entirety of which is incorporated herein by reference.

FIELD OF THE INVENTION(S)

The present inventive subject matter relates to light emitters, systems incorporating such light emitters, and methods of making such light emitters and systems. In particular, the present inventive subject matter is directed to fault tolerant light emitters, systems incorporating them, and methods of making them.

BACKGROUND OF THE INVENTION(S)

To date, the highest light extraction for an LED (light emitting diode) chip and LED package (more chip-specific than package-specific) has generally been with small LED chips (~300 micrometers×300 micrometers) as compared with "power chips" (LEDs of ~0.9-1 mm×0.9-1 mm).

Efforts have been ongoing to develop ways by which solid state light emitting devices can be used in place of incandescent lights, fluorescent lights and other light-generating devices in a wide variety of applications. In addition, where light emitting diodes (or other solid state light emitting devices) are already being used, efforts are ongoing to provide light emitting diodes (or other solid state light emitting devices) which have improved energy efficiency.

Various efforts have been directed at improving the performance of light emitting diodes on a common substrate. For example:

U.S. Pat. No. 6,635,503 describes cluster packaging of light emitting diodes;

United States Patent Application Publication No. 2003/0089918 describes broad spectrum light emitting devices and methods and systems for fabricating broad spectrum light emitting devices;

U.S. Pat. No. 6,547,249 describes monolithic series/parallel light emitting diode arrays formed on highly resistive substrates;

U.S. Pat. No. 7,009,199 describes electronic devices having a header and anti-parallel connected light emitting diodes for producing light from AC current;

U.S. Pat. No. 6,885,035 describes multi-chip semiconductor light emitting diode assemblies;

U.S. Pat. Nos. 7,213,942 and 7,221,044 each describe single chip integrated LEDs adapted for direct use with a high AC or DC voltage;

United States Patent Application Publication No. 2005/0253151 describes a light emitting device operating on a high drive voltage and a small drive current;

Japanese Patent Publication No. 2001-156331 describes a plurality of nitride semiconductor layers formed on the same substrate, where the layers are electrically separated from each other and each nitride semiconductor layer is electrically connected with a conductive wire;

Japanese Patent Publication No. 2001-307506 describes two or more light emitting diodes being formed on the same semiconductor substrate; and United States Patent Application Publication No. 2007/0202623 describes a wafer level package for very small footprint and low profile white LED devices.

SUMMARY OF THE INVENTION(S)

The question of whether or not "power chips" (larger area LEDs) make sense in a given LED lighting (illumination) application should be viewed at the "systems level". That is, it is necessary to consider "chip" (LED) efficiency, package efficiency, driver (AC to DC conversion) efficiency and optic efficiency.

The best performance of driver technology for devices which include LED chips (and/or one or more other solid state light emitting devices) is with "higher voltage, lower current" compared to "lower voltage, higher current". Typical small LED chips run at ~20-30 mA of current and ~3 volts, whereas typical power chips run at ~350 mA and 3 volts.

The improved driver technology at lower drive currents can be viewed as follows:

a) There is a fixed cost (power drops) that occurs in a driver assembly. These driver assemblies are made of "pn junctions" so that there is a power loss each time that a "junction" is added in the driver technology. Hence, the overhead (this fixed cost of power) can be amortized over each LED, such that the cost of going to higher voltage strings and many LEDs is better than lower voltage strings and few parts.

b) The associated loss of power with current (at fixed resistance) is $I^2R$. Hence, the lower current approach will always reach higher efficiencies.

Owing to this, driver efficiencies of 80%-85% are obtainable for "power LED technology" while driver efficiencies of 95% are obtainable for standard LED technology.

In accordance with the present inventive subject matter, there is provided a light emitter which comprises a plurality of light emitting devices which are mechanically interconnected to one another (e.g., on a common substrate on which the devices were formed) and which are electrically interconnected to provide an array of at least two serially connected subsets of light emitting devices, each subset comprising at least three light emitting devices electrically connected in parallel. The light emitting devices are electrically interconnected to provide an array of light emitting devices, the array sometimes herein being referred to as including "rows" and "columns." Each of the "rows" in the array is one of the subsets of parallel-connected light emitting devices. Each of the "columns" in the array includes one of the light emitting devices from each of the subsets, i.e., the array includes a number of columns which is equal to the number of light emitting devices in each of the "rows" (i.e., subsets). The present inventive subject matter, however, is not limited to light emitters in which each subset includes the same number of light emitting devices, i.e., the present inventive subject matter encompasses light emitters in which some or all of the subsets include different numbers of light emitting devices. Thus, the arrays include at least three columns and at least two rows of light emitting devices.

The expression "high voltage", as used herein, means that the voltage drop across a light emitter is at least three times that of one of the light emitting devices included in the light emitter, i.e.:

$V \geq V_f$ of at least three series light emitting devices.

In some embodiments, the light emitting devices are electrically interconnected on a common substrate. The expression "electrically connected on a common substrate", as used herein, and analogous statements (e.g., "electrically connected on a substrate"), means that the electrical connection(s) is/are made on the same structure of which the substrate is a part, e.g., the electrical connection(s) can be above and/or below the substrate, and/or there can be no structures or layer, or there can be one or more structures or layers, between the structure which provides the electrical connection(s) and the substrate. In some embodiments, the forward voltage of the light emitter is at least 325 volts and in others, the forward voltage of the light emitter is at least 395 volts.

The light emitting devices can be any desired component which is capable of emitting light upon being supplied with electricity, e.g., solid state light emitting devices. In particular embodiments of the present inventive subject matter, the light emitting devices are light emitting diodes (LEDs). In some of such embodiments, the LEDs are electrically interconnected on a common substrate. In some embodiments, the LEDs are isolated from one another by one or more insulating region, in other embodiments, the LEDs are isolated from one another by one or more trench, and in still further embodiments, the LEDs are isolated by both one or more trench and one or more insulating region. The LEDs may be lateral devices, vertical devices or some of each.

In some embodiments of the present inventive subject matter, a light emitter includes a plurality of light emitting devices from a contiguous region of a wafer of light emitting devices. As noted above, the plurality of light emitting devices are electrically connected as a plurality of serially connected subsets of at least three parallel connected light emitting devices. In some embodiments, the plurality of serially connected subsets includes at least forty subsets and in other embodiments, the plurality of serially connected subsets includes at least one hundred subsets.

In some embodiments, the plurality of light emitting devices are mechanically connected by a common substrate of the wafer. In such a case, the light emitting devices may be defined by insulating regions that define the peripheries of individual light emitting devices. Alternatively or additionally, the light emitting devices may be defined by one or more trenches that define the peripheries of the individual light emitting devices. The light emitting devices may include lateral devices and/or vertical devices.

In some embodiments of the present inventive subject matter, the light emitter includes a mechanical substrate on which the light emitting devices are mounted to provide mechanical support for the light emitting devices.

Some embodiments of the present inventive subject matter provide a light emitter, that includes a plurality of light emitting devices, means for mechanically interconnecting the plurality of light emitting devices and means for electrically interconnecting the plurality of light emitting devices to provide serially connected subsets, each subset comprising at least three light emitting devices that are electrically interconnected in parallel.

In some embodiments, means for healing a short circuit failure of one or more of the plurality of light emitting devices may also be provided.

A lighting system is also provided that includes a boost power supply having an output voltage that is greater than a corresponding input voltage, and a light emitter. The light emitter includes a plurality of light emitting devices from a contiguous region of a wafer of light emitting devices, the plurality of light emitting devices being electrically connected as a plurality of serially connected subsets of at least three parallel connected light emitting devices electrically coupled to the output voltage of the boost power supply. The boost power supply may be configured to be coupled to an AC power source to provide the input voltage.

In another aspect of the present inventive subject matter, there is provided a light emitter, comprising:

a plurality of light emitting devices formed on a common substrate, each of the light emitting devices comprising means for generating light, means for electrically connecting at least first, second and third of the light emitting devices in parallel as a first subset;

means for electrically connecting at least fourth, fifth and sixth of the light emitting devices in parallel as a second subset;

means for electrically connecting the first subset and the second subset in series.

In some embodiments of this aspect of the present inventive subject matter:

the first light emitting device comprises a first n-type region and a first p-type region;

the second light emitting device comprises a second n-type region and a second p-type region;

the third light emitting device comprises a third n-type region and a third p-type region;

the fourth light emitting device comprises a fourth n-type region and a fourth p-type region;

the fifth light emitting device comprises a fifth n-type region and a fifth p-type region;

the sixth light emitting device comprises a sixth n-type region and a sixth p-type region;

the first n-type region, the second n-type region, the third n-type region, the fourth n-type region, the fifth n-type region and the sixth n-type region are each regions of a single monolithic n-type layer;

the first p-type region, the second p-type region, the third p-type region, the fourth p-type region, the fifth p-type region and the sixth p-type region are each regions of a single monolithic p-type layer;

the light emitter comprises means for isolating each of the first n-type region, the second n-type region, the third n-type region, the fourth n-type region, the fifth n-type region and the sixth n-type region from each other; and the light emitter comprises means for isolating each of the first p-type region, the second p-type region, the third p-type region, the fourth p-type region, the fifth p-type region and the sixth p-type region from each other.

A statement that two or more elements are "isolated" from each other means that the respective elements are not electrically connected with each other (even though, for example, they might both be in contact with another element).

Statements herein that two or more elements are each isolated regions of a single monolithic layer (e.g., "the first n-type region, the second n-type region, the third n-type region, the fourth n-type region, the fifth n-type region and the sixth n-type region are each isolated regions of a single monolithic n-type layer"), and similar statements, means that (at least) each of the elements (e.g., each of the light emitting diode devices or each of the first through sixth n-type regions, etc.) includes structural features which persons of ordinary skill in the art recognize inherently result from being formed as a single integral monolithic layer and later being isolated from each other, e.g., by forming one or more trenches, implanting ions, etc., such that electricity cannot be conducted directly between the respective n-type regions. Analogous statements apply with respect to analogous statements herein, e.g., that p-type regions are isolated regions of a single monolithic p-type layer, etc.

In another aspect of the present inventive subject matter, there is provided a light emitter, comprising:

at least first, second, third, fourth, fifth and sixth solid state light emitting devices, the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, a cathode end of the first solid state light emitting device being electrically connected to a cathode end of the second solid state light emitting device and a cathode end of the third solid state light emitting device;

the cathode end of the first solid state light emitting device being electrically connected to an anode end of the fourth solid state light emitting device;

the anode end of the fourth solid state light emitting device being electrically connected to an anode end of the fifth solid state light emitting device and an anode end of the sixth solid state light emitting device; and a cathode end of the fourth solid state light emitting device being electrically connected to a cathode end of the fifth solid state light emitting device and a cathode end of the sixth solid state light emitting device.

In another aspect of the present inventive subject matter, there is provided a light emitter, comprising:

at least first, second, third, fourth, fifth and sixth solid state light emitting devices;

the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, a first anode electrically connected to the first p-type region;

a first cathode electrically connected to the first n-type region;

a second anode electrically connected to the second p-type region;

a second cathode electrically connected to the second n-type region;

a third anode electrically connected to the third p-type region;

a third cathode electrically connected to the third n-type region;

a fourth anode electrically connected to the fourth p-type region;

a fourth cathode electrically connected to the fourth n-type region;

a fifth anode electrically connected to the fifth p-type region;

a fifth cathode electrically connected to the fifth n-type region;

a sixth anode electrically connected to the sixth p-type region;

a sixth cathode electrically connected to the sixth n-type region;

a first interconnect electrically connected to the first anode, the second anode and the third anode;

a second interconnect electrically connected to the first cathode, the second cathode and the third cathode; and a third interconnect electrically connected to the fourth cathode, the fifth cathode and the sixth cathode.

In some embodiments according to this aspect of the present inventive subject matter, the light emitter further comprises at least one fuse link electrically connected in series with at least one of the light emitting devices.

In some embodiments according to this aspect of the present inventive subject matter, the light emitter further comprises at least one means for opening an electrically conductive connection in series with at least one of the light emitting devices.

In another aspect of the present inventive subject matter, there is provided a light emitter, comprising:

at least first, second, third, fourth, fifth and sixth solid state light emitting devices;

the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, a first p-type contact electrically connected to the first p-type region, a first n-type contact electrically connected to the first n-type region, a second p-type contact electrically connected to the second p-type region, a second n-type contact electrically connected to the second n-type region, a third p-type contact electrically connected to the third p-type region, a third n-type contact electrically connected to the third n-type region, a fourth p-type contact electrically connected to the fourth p-type region, a fourth n-type contact electrically connected to the fourth n-type region, a fifth p-type contact electrically connected to the fifth p-type region, a fifth n-type contact electrically connected to the fifth n-type region, a sixth p-type contact electrically connected to the sixth p-type region, a sixth n-type contact electrically connected to the sixth n-type region, a first interconnect electrically connected to the first p-type contact, the second p-type contact and the third p-type contact, a second interconnect electrically connected to the first n-type contact, the second n-type contact and the third n-type contact, a third interconnect electrically connected to the fourth p-type contact, the fifth p-type contact and the sixth p-type contact, and a conductive via electrically connected to the second interconnect and the third interconnect, the conductive via extending through the p-type layer.

In some embodiments according to this aspect of the present inventive subject matter, the light emitter further comprises at least one fuse link electrically connected in series with at least one of the light emitting devices.

In some embodiments according to this aspect of the present inventive subject matter, the light emitter further comprises at least one means for opening an electrically conductive connection in series with at least one of the light emitting devices.

In another aspect of the present inventive subject matter, there is provided a light emitter, comprising:

at least first, second, third, fourth, fifth and sixth solid state light emitting devices; and a substrate, the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, the first solid state light emitting device, the second solid state light emitting device, the third solid state light emitting device, the fourth solid state light emitting device, the fifth solid state light emitting device and the sixth solid state light emitting device being on the substrate, an anode end of the first solid state light emitting device being electrically connected to an anode end of the second solid state light emitting device and an anode end of the third solid state light emitting device;

a cathode end of the first solid state light emitting device being electrically connected to a cathode end of the second solid state light emitting device and a cathode end of the third solid state light emitting device;

the cathode end of the first solid state light emitting device being electrically connected to an anode end of the fourth solid state light emitting device;

the anode end of the fourth solid state light emitting device being electrically connected to an anode end of the fifth solid state light emitting device and an anode end of the sixth solid state light emitting device; and a cathode end of the fourth solid state light emitting device being electrically connected to a cathode end of the fifth solid state light emitting device and a cathode end of the sixth solid state light emitting device.

In some embodiments according to this aspect of the present inventive subject matter, the light emitter further comprises at least one fuse link electrically connected in series with at least one of the light emitting devices.

In some embodiments according to this aspect of the present inventive subject matter, the light emitter further comprises at least one means for opening an electrically conductive connection in series with at least one of the light emitting devices.

In another aspect of the present inventive subject matter, there is provided a light emitter, comprising:

at least a first array of solid state light emitting devices and a second array of solid state light emitting devices, the first array of solid state light emitting devices comprising at least first, second, third, fourth, fifth and sixth solid state light emitting devices, the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, a cathode end of the first solid state light emitting device being electrically connected to a cathode end of the second solid state light emitting device and a cathode end of the third solid state light emitting device;

a cathode end of the fourth solid state light emitting device being electrically connected to a cathode end of the fifth solid state light emitting device and a cathode end of the sixth solid state light emitting device;

the cathode end of the first solid state light emitting device being electrically connected to an anode end of the fourth solid state light emitting device;

the anode end of the first solid state light emitting device being electrically connected to the anode end of the second solid state light emitting device and the anode end of the third solid state light emitting device, the first array and the second array being electrically arranged in an anti-parallel relationship.

In some embodiments according to this aspect of the present inventive subject matter, the second array comprises at least seventh, eighth, ninth, tenth, eleventh and twelfth solid state light emitting devices, the seventh solid state light emitting device comprising a seventh n-type region and a seventh p-type region, the eighth solid state light emitting device comprising an eighth n-type region and an eighth p-type region, the ninth solid state light emitting device comprising a ninth n-type region and a ninth p-type region, the tenth solid state light emitting device comprising a tenth n-type region and a tenth p-type region, the eleventh solid state light emitting device comprising an eleventh n-type region and an eleventh p-type region, the twelfth solid state light emitting device comprising a twelfth n-type region and a twelfth p-type region, the seventh n-type region, the eighth n-type region, the ninth n-type region, the tenth n-type region, the eleventh n-type region and the twelfth n-type region each being isolated regions of a single monolithic n-type layer, the seventh p-type region, the eighth p-type region, the ninth p-type region, the tenth p-type region, the eleventh p-type region and the twelfth p-type region each being isolated regions of a single monolithic p-type layer, a cathode end of the seventh solid state light emitting device being electrically connected to a cathode end of the eighth solid state light emitting device and a cathode end of the ninth solid state light emitting device;

a cathode end of the tenth solid state light emitting device being electrically connected to a cathode end of the eleventh solid state light emitting device and a cathode end of the twelfth solid state light emitting device;

the cathode end of the seventh solid state light emitting device being electrically connected to an anode end of the tenth solid state light emitting device; and the anode end of the seventh solid state light emitting device being electrically connected to the anode end of the eighth solid state light emitting device and the anode end of the ninth solid state light emitting device.

In some embodiments according to this aspect of the present inventive subject matter, at least the solid state light emitting devices in the first array and the solid state light emitting devices in the second array have a common substrate.

In some embodiments according to this aspect of the present inventive subject matter, at least the first n-type region, the second n-type region, the third n-type region, the fourth n-type region, the fifth n-type region, the sixth n-type region and the n-type regions of the solid state light emitting devices in the second array are all part of the same integral n-type element.

In some embodiments according to this aspect of the present inventive subject matter, at least the first p-type region, the second p-type region, the third p-type region, the fourth p-type region, the fifth p-type region, the sixth p-type region and the p-type regions of the solid state light emitting devices in the second array are all part of the same integral p-type element.

In another aspect of the present inventive subject matter, there is provided a circuit for a light emitter, the circuit comprising:

a rectifying bridge;

at least first, second, third, fourth, fifth and sixth solid state light emitting devices, the first solid state light emitting device comprising a first n-type region and a first p-type region, the second solid state light emitting device comprising a second n-type region and a second p-type region, the third solid state light emitting device comprising a third n-type region and a third p-type region, the fourth solid state light emitting device comprising a fourth n-type region and a fourth p-type region, the fifth solid state light emitting device comprising a fifth n-type region and a fifth p-type region, the sixth solid state light emitting device comprising a sixth n-type region and a sixth p-type region, the first n-type region, the second n-type region, the third n-type region, the fourth n-type region, the fifth n-type region and the sixth n-type region each being isolated regions of a single monolithic n-type layer, the first p-type region, the second p-type region, the third p-type region, the fourth p-type region, the fifth p-type region and the sixth p-type region each being isolated regions of a single monolithic p-type layer, a cathode end of the first solid state light emitting device being electrically connected to a cathode end of the second solid state light emitting device and a cathode end of the third solid state light emitting device;

a cathode end of the fourth solid state light emitting device being electrically connected to a cathode end of the fifth solid state light emitting device and a cathode end of the sixth solid state light emitting device;

the cathode end of the first solid state light emitting device being electrically connected to an anode end of the fourth solid state light emitting device; and the anode end of the first solid state light emitting device being electrically connected to the anode end of the second solid state light emitting device and the anode end of the third solid state light emitting device.

In some embodiments according to this aspect of the present inventive subject matter, the rectifying bridge comprises at least one solid state light emitting device.

Methods of fabricating a light emitter are also provided. Such methods may include forming a plurality of light emitting devices on a substrate and electrically connecting the light emitting devices to provide an array of light emitting devices, where, as discussed above, the light emitting devices in a subset (or row) within in the array are connected in parallel and in which the subsets in the array are connected in series. The subsets in the array each include at least three light emitting devices, and the number of rows in the array provide a forward voltage for the light emitter of at least 18 volts.

Some embodiments provide methods of fabricating a light emitting device that include forming a plurality of light emitting device layers on a substrate, defining individual light emitting devices in regions of the light emitting device layers and electrically connecting the individual light emitting devices on the substrate to provide serially connected subsets of the light emitting devices. Each of the subsets comprises at least three light emitting devices electrically connected in parallel.

In some embodiments, defining individual light emitting devices comprises implanting ions about the peripheries of the light emitting devices to provide one or more insulating or semi-insulating region that defines the peripheries of the individual light emitting devices.

In some embodiments, each of the light emitting devices comprises lateral light emitting device having a first surface on which a first ohmic contact is provided on a first contact layer of the respective light emitting device and a second, buried, contact layer. In such embodiments, electrically connecting individual light emitting devices may include: (a) for each light emitting device, forming a conductive region that extends from the first surface through the insulating or semi-insulating region of the light emitting device to electrically connect to the buried contact layer, (b) for each light emitting layer, forming an ohmic contact on the conductive region to provide a second ohmic contact electrically connected to the buried contact layer and (c) forming an electrical interconnection pattern on the respective first surfaces to selectively interconnect first ohmic contacts and second ohmic contacts to provide the serially connected subsets of light emitting devices.

Additionally, forming a conductive region may be provided by forming a highly doped region of semiconductor material of the same conductivity type as the buried contact layer. Alternatively, forming a conductive region may be provided by, for each light emitting device, forming a conductive via extending from the first surface to the buried contact layer.

In some embodiments, each of the light emitting devices comprises a vertical light emitting diode having respective ohmic contacts on opposite faces of the light emitting device. In such a case, electrically connecting individual light emitting devices may be provided by (a) forming interconnection patterns on the opposite faces of the light emitting devices to electrically connect respective ohmic contacts of the light emitting devices into the subsets of light emitting devices, the interconnection patterns extending onto the electrically insulating or semi-insulating regions, and (b) forming conductive vias through the electrically insulating or semi-insulating region to selectively electrically connect respective interconnection patterns so as to serially connect the subsets of light emitting devices.

In some embodiments, light extraction features are formed in the substrate.

In some embodiments, defining individual light emitting devices comprises forming one or more trench about the peripheries of the light emitting devices, wherein the trench defines the peripheries of the individual light emitting devices. In such embodiments, where the light emitting devices include a first ohmic contact and the trench extends to a contact layer of the light emitting device, the methods may further include forming a second ohmic contact on the contact layer, filling the trench with an insulator material and forming a conductive via through the insulator material to contact the ohmic contact. Electrically connecting the individual light emitting devices may include forming interconnection patterns that electrically connect first contacts of a first subset of light emitting devices to conductive vias associated with second contacts of a second subset of light emitting devices.

In some embodiments of the present inventive subject matter, the method further comprises testing at least one of the light emitting devices.

In some embodiments of the present inventive subject matter, the method further comprises testing at least one of the light emitting devices and electrically disconnecting one of the light emitting devices from the light emitting device.

In some embodiments of the present inventive subject matter, the step of electrically disconnecting one of the light emitting devices is carried out by etching an anode contact or a cathode contact of one of the light emitting devices. In some of such embodiments, the step of electrically disconnecting one of the light emitting devices is carried out by applying insulating material on an anode contact or a cathode contact of one of the light emitting devices.

The present inventive subject matter provides light emitters in which activation of the light emitter (i.e., supplying electricity to it) activates more than one light emitting device contained in the light emitter, i.e., the light emitters are not arrays of individual addressable light emitting devices (such as in the case of displays and the like).

DETAILED DESCRIPTION OF THE INVENTION(S

Figure 1:
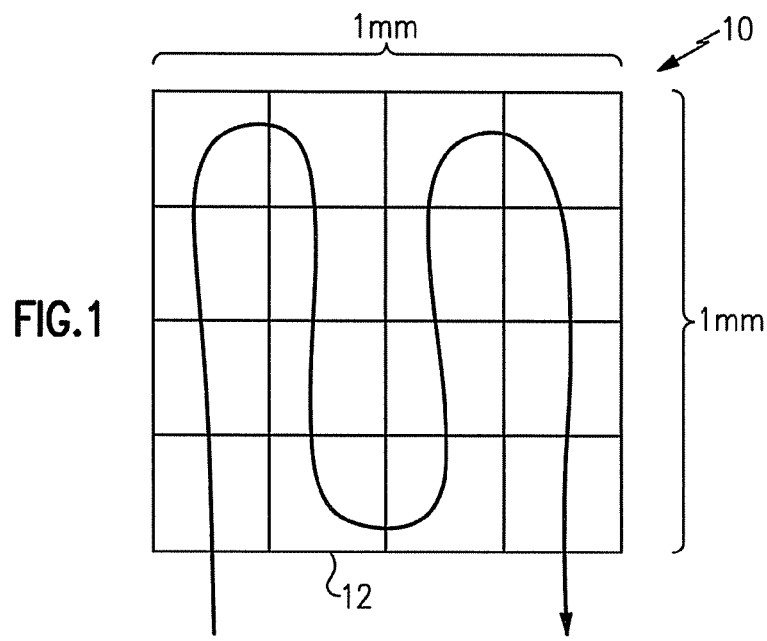
FIG. 1 is a top view of a light emitter provided by a string of serially connected light emitting diodes on a common substrate.

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As noted above, the various aspects of the present inventive subject matter include various combinations of electronic components (transformers, switches, diodes, capacitors, transistors, etc.). Persons skilled in the art are familiar with and have access to a wide variety of such components, and any of such components can be used in making the devices according to the present inventive subject matter. In addition, persons skilled in the art are able to select suitable components from among the various choices based on requirements of the loads and the selection of other components in the circuitry.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, an implanted region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

According to the present inventive subject matter, there is provided a higher voltage, lower current device, so that the system benefits can be obtained. While the discussion herein frequently refers to LEDs, the present inventive subject matter is applicable to all types of light emitting devices, e.g., solid state light emitting devices, a variety of which are well-known to those skilled in the art. Such solid state light emitting devices include inorganic and organic light emitters. Examples of types of such light emitting devices include a wide variety of light emitting diodes (inorganic or organic, including polymer light emitting diodes (PLEDs)), laser diodes, thin film electroluminescent devices, light emitting polymers (LEPs), a variety of each of which are well-known in the art.

According to the present inventive subject matter, instead of using a single P/N junction, the device is made into multiple regions so that each isolated region can be series connected to obtain the desired arrangements that provide higher voltage operation and fault tolerance in the device. In this way, a large area (single component) can be used with the benefit of placing (or packaging) fewer chips while still obtaining the best overall system performance.

Figure 2:
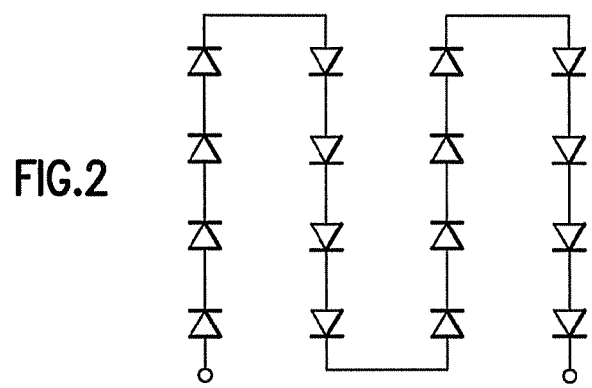
FIG. 2 is an electrical schematic of the light emitter of FIG. 1.

FIG. 1 depicts a representative light emitter 10 having multiple interconnected regions 12. The light emitter 10 of FIG. 1 may provide a high voltage light emitter having a relatively small area. However, the manufacturability of such a light emitter may depend on the composition of the respective regions and how the respective regions of the light emitter are electrically interconnected. For example, if the regions are individual light emitting diodes connected serially as described in FIG. 2, such a light emitter may be difficult to fabricate in that failure of a single light emitting diode as an open circuit in the string would result in loss of the entire string. For single string devices, this would result in a complete loss of light output from the device or one entire string for multiple string devices. Because the light emitting devices are on a common substrate and it would be difficult to repair or replace the individual devices, a failure of one device could result in rejection of the entire part. As such, the overall yield in producing such light emitters would be lower per unit area of wafer than the yield for the individual devices that make up the light emitter.

Figure 3:
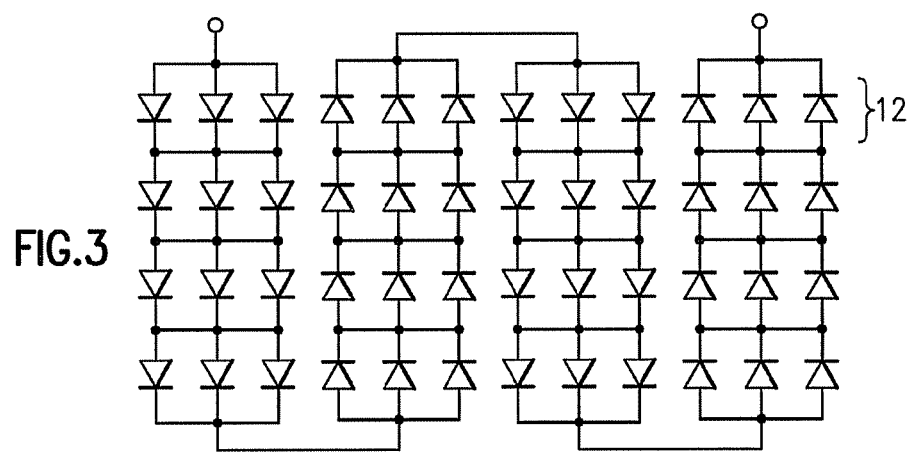
FIG. 3 is an electrical schematic of light emitting diodes arranged as an array of serially connected parallel subsets of light emitting diodes according to some embodiments of the present inventive subject matter.

To overcome problems associated with series strings of devices, the "high voltage" light emitter according to the present inventive subject matter is configured in a series of parallel-connected subsets (i.e., the light emitting devices are electrically connected as a plurality of serially connected subsets, each subset comprising at least three parallel-connected light emitting devices). Such an arrangement (i.e., a series of parallel-connected subsets) is illustrated in FIG. 3. The interconnected regions 12 include parallel-connected light emitting devices. These parallel-connected subsets of the light emitting devices are then serially connected. The parallel-connected subsets provide redundancy if a failure occurs (open or short). If an open occurs, only one device or pixel is lost for the entire construction. If a short occurs, all devices in that particular, parallel subset (three are shown in the light emitter depicted in FIG. 3) fail. These failures could occur at t=0 (upon fabrication and test) or in the field (in use). Such an arrangement (i.e., series of parallel-connected subsets) permits the ability to increase wafer yield (higher yielding wafer), which is an extremely important result.

While FIG. 3 illustrates sixteen subsets of devices in series, other numbers of devices in series may also be provided. The number of subsets can be selected based on the forward voltage drop of the light emitting devices utilized and the desired operation voltage. For example, forty subsets or more may be connected in series. Such a series connection for a device with a forward voltage of 3.2 volts would be 128V. Similarly, 100 or more subsets could be connected in series to provide light emitters with operating voltages of 300 volts or more. For example, subsets could be connected in series to provide an operating voltage of 325 volts or more or even 395 volts or more. Such light emitters could be operated, for example, with a boost power supply from a 230 VAC or 277 VAC line voltage as described below.

The light emitters according to the present inventive subject matter can be manufactured on an "insulating substrate"—for example, standard InGaN on sapphire. For conventional power chips on conductive SiC, insulating or semi-insulating SiC can be used, or an insulating "buffer layer" can be used so that active layers (and subsequent devices) can be isolated from one another.

Alternatively, new chip platforms (e.g., the EZ chip from Cree Research, Inc., or "thinGaN" from Osram Opto Semiconductors, GmbH) are moving to a substrateless chip/dice assembly. This takes the active device to a very thin configuration. In such devices, as the thickness is reduced, the brightness increases. In these cases, the "thin LED" structures are mounted to a supporting substrate with a mirror layer to direct light out the device (GaN) side. Nonetheless, the same "high voltage" configuration will boost overall system efficiency.

FIGS. 1 and 3 show configurations based upon keeping the device less than 60 volts (class 1 vs. class 2 cutoff for Underwriter's Laboratory standards). However, any configuration (voltage) can be designed. FIG. 1 is a conceptual view of a 1 mm×1 mm chip having sixteen regions (4×4) arranged in series. FIG. 3 is a circuit diagram of a die having sixteen regions connected in series, each region including three sub-regions connected in parallel, i.e., each region including a subset of parallel connected light emitting devices.

While FIG. 1 illustrates a 1 mm×1 mm chip, other chip sizes, even larger chip sizes could be provided. For example, 3 mm×3 mm or larger chips could be provided. Additionally, the present inventive subject matter could also be utilized with different sizes of the individual light emitting devices. By building redundancy, the limitation on chip/die size is no longer a "yield hit" at the wafer level. Large area, high voltage chips (with a few pixels out due to materials or fabrication issues) no longer have to be rejected due to a pixel or segment not working, etc.

In certain embodiments of the present inventive subject matter, a plurality of mechanically connected light emitting devices from a common semiconductor substrate are electrically connected to provide a high voltage monolithic large area light emitter. In particular embodiments, the light emitting devices are light emitting diodes (LEDs). The light emitter structure includes a plurality of light emitting devices electrically connected in an array having a dimension of at least three columns of light emitting devices (i.e., each subset includes at least three parallel-connected light emitting devices). The array electrical interconnection provides for the anodes of the light emitting devices in a row (i.e., a subset) to be electrically connected together and the cathodes in a row to be electrically connected to the anodes of the light emitting devices in an adjacent row. The number of "columns" refers to the number of light emitting devices in a row, i.e., whose anodes are electrically connected together. By electrically connecting the light emitting devices in an array, the failure of one or more devices in any row of the array may be compensated for by the other devices in the row. Similarly, by electrically connecting the devices in an array, failure of one or more devices in a column may also be compensated for by the other devices in the array. At least two rows are included, to make the large area multi-light emitting device light emitter a high-voltage device to reduce resistive losses in an overall system for producing light.

Embodiments of the present inventive subject matter may be utilized with any suitable light emitting device structure. Exemplary embodiments are described with reference to an InGaN multi-quantum well light emitting device structure, although any other suitable light emitting device structures can be employed, e.g., ZnO, ZnTe or any other Group III-Group V and/or Group II-Group VI combination, any binary, ternary or quaternary combination of aluminum, indium, gallium and phosphorus, any binary, ternary or quaternary combination of aluminum, indium, gallium and nitrogen, any binary, ternary or quaternary combination of aluminum, gallium, indium and arsenic, or the like may be used, if desired. Thus, any light emitting device structure that provides a common substrate on which multiple light emitting devices may be formed or transferred and which may be interconnected as described herein may be suitable for use in embodiments of the present inventive subject matter.

In particular embodiments, the plurality of light emitting devices that make up a high voltage light emitter come from a contiguous region of a wafer on which the light emitting devices are formed. The expression "light emitting devices come from a contiguous region of a wafer", as used herein, means that plural layers (e.g., at least an n-type layer and a p-type layer) were formed on a wafer, the wafer was treated (e.g., to form one or more trenches and/or insulating regions) to define a plurality of isolated light emitting devices (preferably spaced very closely to each other) and the wafer was divided into at least two light emitting devices (typically a large number of light emitting devices), each of which includes light emitting devices which came from a contiguous region (or the wafer is not divided, and includes light emitting devices which came from a contiguous region). In other words, "contiguous region" means that the entire die came from a single integral region of the wafer, such that separate isolated regions of layers (e.g., n-type or p-type) of light emitting devices which are adjacent to each other on the die were adjacent to each other on the wafer, and are spaced from each other on the die the same or substantially the same distance they were spaced on the wafer. By providing devices from a contiguous region of a wafer, variations in the characteristics of the individual devices may be reduced or even minimized compared with light emitters with light emitting devices from differing parts of a wafer or even different wafers. Such reductions in variation may also increase predictability of device characteristics which may also improve yield or the ability to target specific characteristics in the final product.

Exemplary embodiments of the present inventive subject matter will now be described with reference to FIGS. 4 through 6G, where devices with an insulating substrate or buffer layer are provided. The devices in the embodiments depicted in FIGS. 4 through 6G have two "topside" contacts and are referred to herein as "lateral" devices in that current does not flow through the substrate and/or buffer layer but flows "laterally" to/from a contact through, for example, a current spreading layer or contact layer. In contrast, FIGS. 7 through 9G illustrate exemplary embodiments of the present inventive subject matter incorporating a "vertical" device where current flows "vertically" from one contact to the other. While lateral devices typically have two contacts on the same side of the device and vertical devices typically have contacts on opposing sides of the device, either device could have contacts on the same side or on opposite sides of the device.

Figure 4:
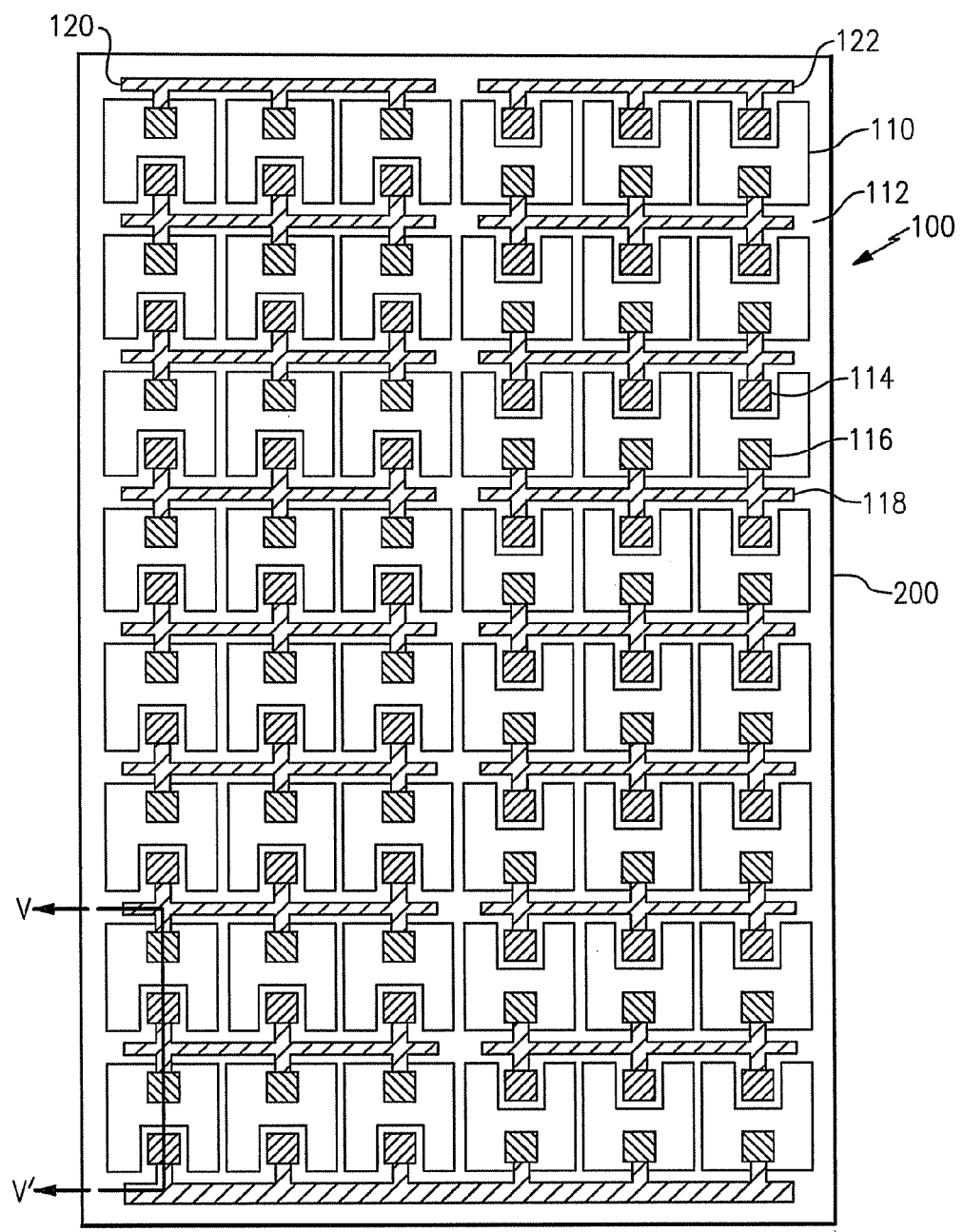
FIG. 4 is a top plan view of a light emitter according to some embodiments of the present inventive subject matter.

FIG. 4 is a top plan view of a large area high voltage monolithic light emitter 100 according to some embodiments of the present inventive subject matter. As seen in FIG. 4, the lighting device 100 includes a plurality of light emitting devices 110 on a common substrate 200. The lighting emitting devices 110 are defined by isolation regions 112 that define the peripheries of the individual light emitting devices 110. The individual light emitting devices 110 each have an anode contact 116 and a cathode contact 114.

As seen in FIG. 4, the anodes 116 of light emitting devices 110 in subsequent rows are connected to the cathodes 114 of devices 110 in previous rows by the interconnection patterns 118. The anodes 116 of devices 110 in a first row of the light emitter 100 are connected together to provide an anode contact 120 for the monolithic light emitter 100. The cathode contacts 114 of the last row of devices 110 in the array are also connected together to provide a cathode contact 122 for the monolithic light emitter 100. Thus, the structure of FIG. 4 provides an array of light emitting devices 110 electrically connected as illustrated in FIG. 3 as a monolithic light emitter 100.

One or more of the monolithic light emitters 100 may be formed on a wafer of light emitting devices 110 and then separated into individual monolithic light emitters 100. Thus, the isolated light emitting devices 110 are separated from a wafer in groups, and in some embodiments in respective groups from contiguous regions of the wafer, so that each contiguous region provides a monolithic structure 100 that includes a plurality of individual light emitting devices 110. This separation process may, for example, be carried out by sawing, scoring and breaking, or by other techniques known to those of skill in the art for separating die within a wafer.

Figure 5A:
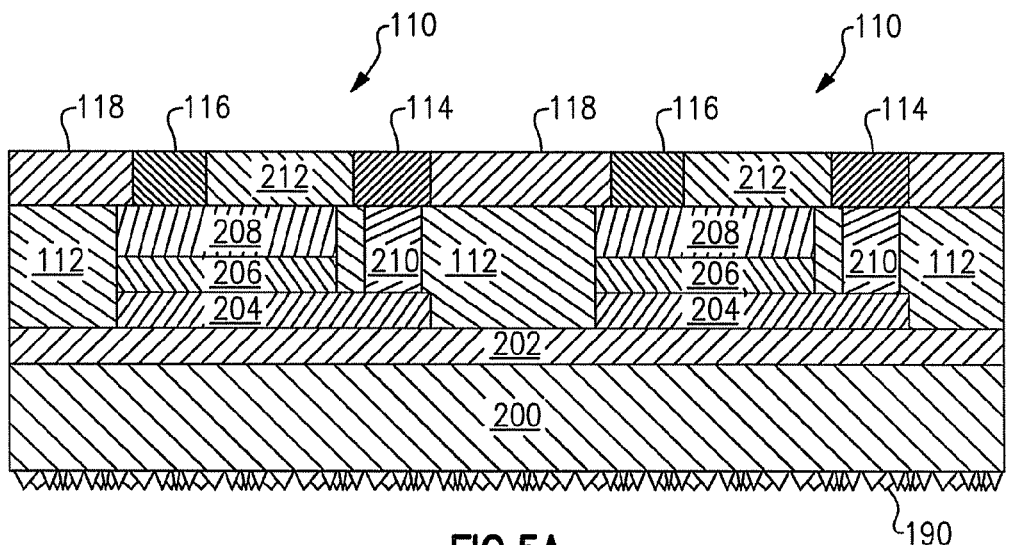
FIG. 5A is a cross-sectional illustration taken along line V-V' of FIG. 4.

FIG. 5A is an exemplary cross-section of the monolithic light emitter 100 taken along lines V-V'. As seen in FIG. 5A, multiple light emitting devices are provided on a common substrate 200. As discussed above, the substrate 200 may comprise any suitable material or combination of materials. For example, the substrate may comprise sapphire, SiC, AlN, GaN, ZnO or other suitable semiconductor substrate. The particular material for the substrate 200 may be selected based on the light emitting devices to be formed on the substrate. Substrates and techniques for forming light emitting devices on substrates are known to those of skill in the art.

Furthermore, in some embodiments, the substrate 200 may be removed or thinned after mounting the monolithic light emitter 100 on another substrate to provide mechanical support for the individual devices. The substrate 200 may also be thinned, laser patterned, etched or subjected to chemical mechanical polishing (CMP). For example, as illustrated in FIG. 5A, light extraction features 190 may also be provided on the substrate to improve extraction of light through the substrate. In particular embodiments, the light extraction features 190 approximate a "moth eye" structure. In other embodiments, other light extraction features may also be provided. Various light extraction features are known to those of skill in the art. Techniques for patterning the substrate for light extraction are also known to those of skill in the art.

In addition, the light emitting devices may also include one or more phosphors or other luminous materials. Such luminous material materials may be provided in or on any desired structure, including on the substrate 200. For example, a YAG phosphor may be provided in a glob or conformal application on the substrate 200. In other embodiments where light extraction is not through the substrate 200, the luminous materials may be provided adjacent a surface from which light is extracted. Various luminous materials and techniques for the application of luminous materials are known to those of skill in the art.

As is further illustrated in FIG. 5A, a buffer layer 202 may optionally be provided on the substrate 200. For example, if the substrate 200 is an electrically conductive substrate, then a non-conductive buffer layer may be provided to isolate the electrically conductive substrate from the light emitting devices. Alternatively or additionally, the buffer layer 202 may provide for transitions in materials, for example, to lattice match the substrate 200 to the materials that form the active regions of the die. For example, an AlN buffer layer may be used between a sapphire substrate and GaN, AlGaN, InGaN or AlInGaN active layers to improve the quality of these active layers in comparison to formation of these layers directly on the sapphire substrate. The particular buffer layer material can be selected based on the materials of the substrate and the active layers, with suitable choices for different substrate/active layer combinations being well-known to those skilled in the art. Buffer layers and techniques for the use of buffer layers in fabricating light emitting devices are known to those of skill in the art and need not be described further herein.

Each light emitting device 110 depicted in FIG. 5A also includes an n-type semiconductor layer 204 that may act as a contact layer, one or more quantum well layers 206 and a p-type semiconductor layer 208 that also may act as a contact layer. These layers are collectively referred to as the "active layers" of the device. The particular structure, materials and configuration of the active layers may be any suitable structure, materials or configuration that is capable of producing light when a current passes between the p-type layer and the n-type layer. Various structures, materials and configurations for the active layers of a light emitting device are known to those of skill in the art. Any suitable structures, materials and configurations for the active layers may be utilized in embodiments of the present inventive subject matter as long as such structures, materials and configurations allow for the electrical interconnection of individual devices on the substrate 200 as described herein with reference to the exemplary structures, materials and configurations. In particular embodiments, the structure, materials and configuration may allow for the electrical interconnection of devices which are within a contiguous region on a wafer.

The individual devices 110 of the lighting device 100 are defined by isolation regions 112. The isolation regions 112 may, in some embodiments, be provided by ion implantation to create insulating or semi-insulating regions that extend through the active layers as illustrated in FIG. 5A. Alternatively or additionally, trenches could be formed between the devices 110. The trenches could, optionally, be filled with an insulator, such as $SiO_x$ or SiN, to provide a more planar surface on which the electrical interconnect 118 is provided. Combinations of trenches and implantation could also be provided. For example, a trench could be formed and then ions implanted into the sidewalls and/or bottom of the trench to make these regions insulating or semi-insulating.

Also illustrated in FIG. 5A is an $n^+$ contact region 210 that extends from a top surface of the device through the isolating region 112 to the n-type layer 204. The $n^+$ contact region 210 allows for the formation of the cathode 114 to provide a more planar device. The $n^+$ contact region 210 may, for example, be provided by ion implantation through the isolation region to the n-type layer 204.

Figure 5B:
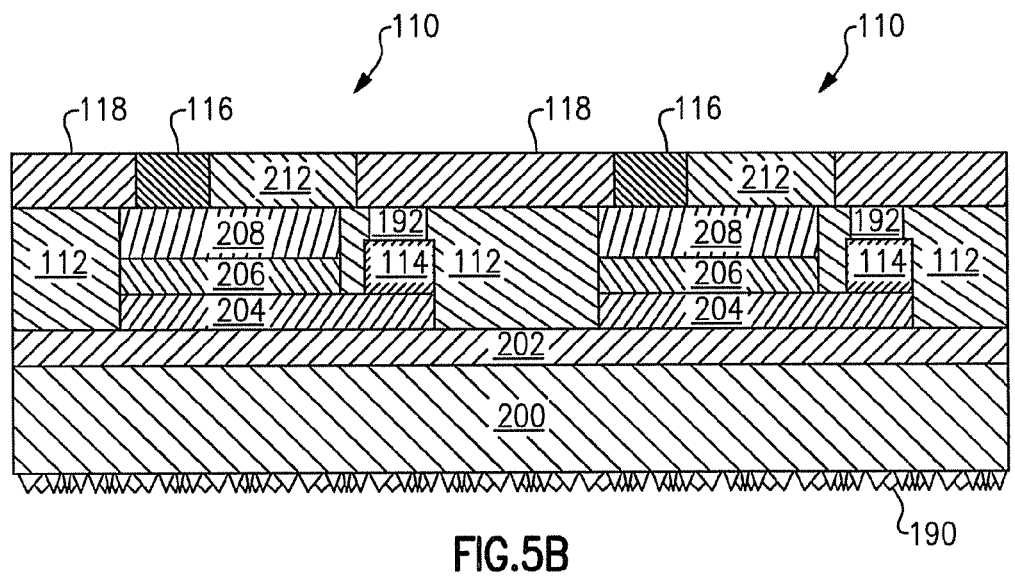
FIG. 5B is a cross-sectional illustration according to alternative embodiments of the present inventive subject matter.

Alternatively, the contact to the n-type layer 204 may be made through a via hole which is then filled with a conductive metal to provide an electrical via 192. For example, a conventional two top side contact device could be fabricated and isolated from adjacent devices utilizing an isolation trench. A cathode contact could be provided on the n-type layer 204. The trench could then be filled with an insulator and a contact hole formed through the insulator to the cathode contact 114. The contact hole could be filled with metal or other conductor to provide an electrical via 192 which is in contact with the electrical interconnection 118. Such a configuration is illustrated in FIG. 5B. Alternatively, a via could be formed through an ion implanted isolation region as described above. Techniques for forming vias and then filling them with metal or other conductors are known to those of skill in the art.

With regard to either FIG. 5A or FIG. 5B, an n-type contact 114 provides a cathode contact for each device and a p-type contact 116 provides an anode contact for each device. The particular configuration and composition of the n-type and p-type contacts 114 and 116 can be selected based on the material system of the lighting device. Techniques for fabricating n-type and p-type ohmic contacts in differing materials systems are well known to those of skill in the art. Embodiments of the present inventive subject matter may be utilized with any type of ohmic contact that is capable of being electrically interconnected to ohmic contacts of other die on the wafer.

FIGS. 5A and 5B also illustrate an optional insulating layer 212 that may be provided on exposed portions of the devices and/or between devices. The insulating layer 212 may function as a protective and/or passivation layer for the devices. Such a layer may be the result of the fabrication of the interconnection or may be provided as a separate layer after fabrication of the remainder of the device. Additionally, multiple layers may also be provided, for example, an Oxide-Nitride-Oxide (ONO) or Nitride-Oxide (NO) structure may be utilized.

Figure 6A:
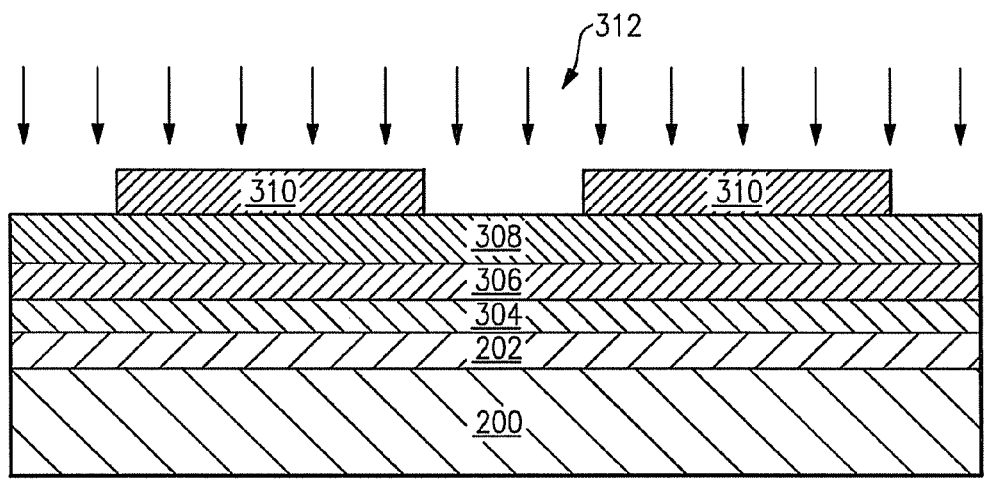
FIGS. 6A through 6G are cross-sectional illustrations illustrating fabrication of devices according to some embodiments of the present inventive subject matter.

FIGS. 6A through 6G illustrate an exemplary series of processing steps for providing a lighting device 100 according to some embodiments of the present inventive subject matter. As seen in FIG. 6A, a mask 310 is deposited and patterned on a wafer having an n-type active layer 304, quantum well layer 306 and p-type active layer 308 formed thereon. As discussed above, any desired known particular configuration and fabrication of active layers can be employed according to the present inventive subject matter, and any suitable technique and materials for forming active layers may be utilized. The patterned mask 310 opens windows corresponding to the isolation regions between the individual devices. Mask materials and techniques for patterning masks are well known to those of skill in the art and need not be described in detail here. After patterning the mask 310, ions 312 are implanted in the active layers 304, 306 and 308 to turn the region below the window in the mask 310 insulating or semi-insulating by, for example, damaging the crystal lattice of the underlying semiconductor layers, to form isolation regions 314. Suitable ions and implant energies will depend on the material system, the structure of the underlying device active layers and the dimensions of those layers. The determination of suitable ions and implant energies are within the routine skill of those in the art in light of the present disclosure.

Figure 6B:
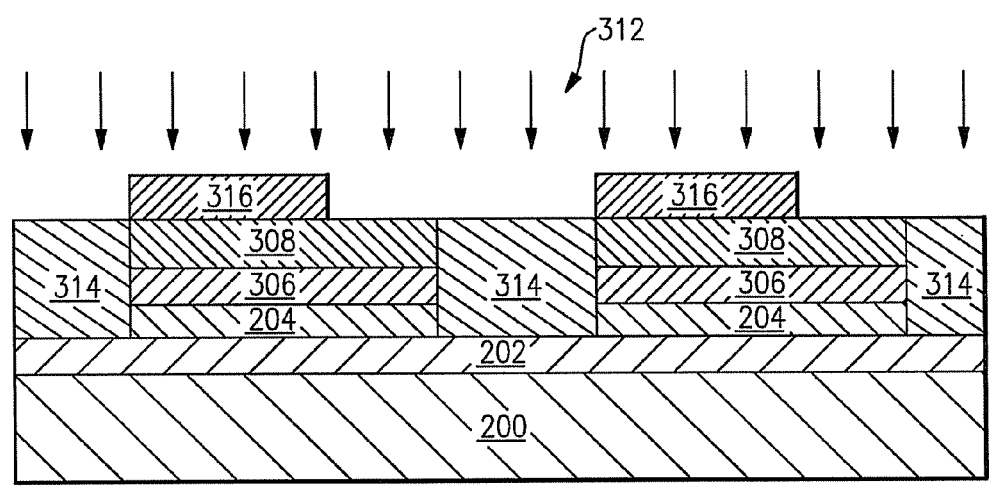
Figure 6C:
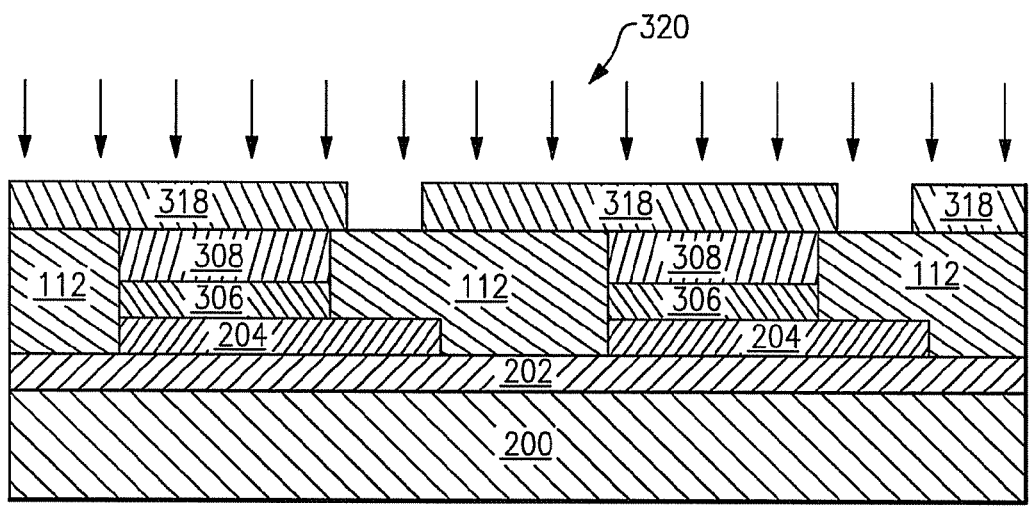

FIG. 6B illustrates the formation of an insulating region through which a contact region to the n-type layer 204 is provided. A second mask layer is formed or further patterning of the mask layer 310 may be performed to provide the second patterned mask layer 316 having windows that expose the region of the active layers 306 and 308 through which the contact region to the n-type layer 204 is formed. Ion implantation may then be performed using the mask layer 316 to implant the ions 312 into the active layers 306 and 308 to make the region below the window in the mask layer 316 insulating or semi-insulating, FIG. 6C illustrates one technique for forming a contact region to the n-type layer 204 to provide substantially planar contacts for the devices 110. In FIG. 6C, the mask layer 316 is removed and a third mask layer 318 is formed and patterned to provide windows corresponding to the contact region 210. Ion implantation is performed using the mask layer 318 to implant ions 320 into the exposed regions of the active layers 306 and 308 to provide an $n^+$ contact region that extends to and/or into the n-type layer 204. In some material systems, an anneal of the implanted region may be performed to activate the implanted ions. Such anneal may be provided as a separate step or may be provided as part of another anneal step, for example, if an anneal is provided to form the ohmic contact to the p-type region.

As used herein, references to "+" or "−" in the context of n-type or p-type semiconductor materials are relative indications of the level of doping of such regions. Thus, for example, the $n^+$ contact region 210 would be more highly doped than the n-type layer 204.

Figure 6D:
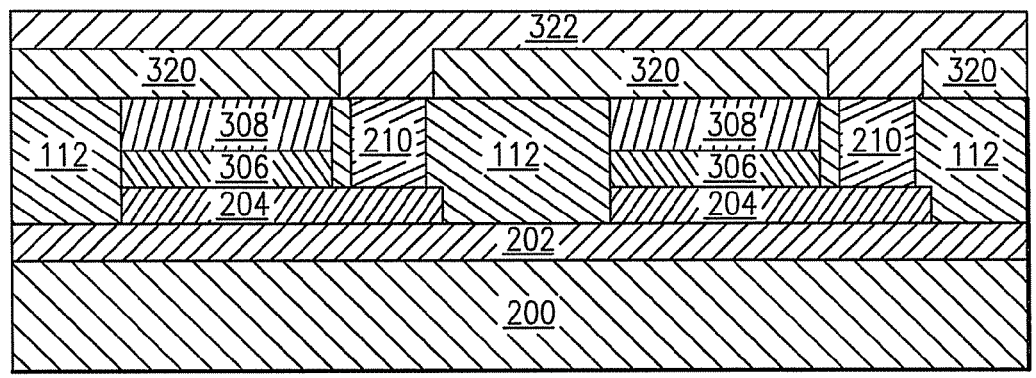

FIG. 6D illustrates the formation of the ohmic contact 114 to the n-type contact region 210. A fourth mask layer is formed or further patterning of the third mask layer 318 may be performed to provide the fourth patterned mask layer 320 having windows that expose the $n^+$ contact region 210. A blanket deposition of contact material and, in some embodiments contact metal, is performed to provide the contact layer 322. The portions of the contact layer 322 formed on the fourth patterned mask layer 320 are removed by, for example, CMP, lift-off or other techniques known to those of skill in the art, to provide the ohmic contact 114 to the $n^+$ contact region 210.

Figure 6E:
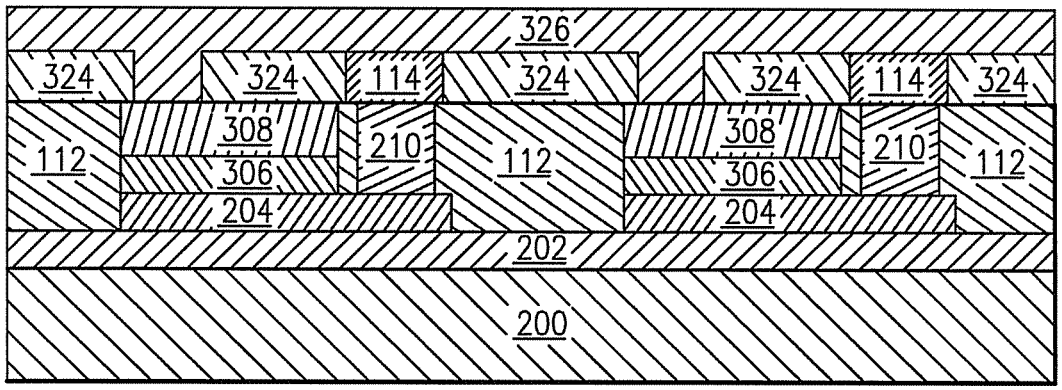

FIG. 6E illustrates the formation of the ohmic contact 116 to the p-type region 308. A fifth mask layer is formed and patterned, for example, by blanket deposition and patterning, to provide the fifth patterned mask layer 324 having windows that expose the p-type layer 308. A blanket deposition of contact material and, in some embodiments contact metal, is performed to provide the contact layer 326. The portions of the contact layer 326 formed on the fifth patterned mask layer 324 are removed by, for example, CMP, lift-off or other techniques known to those of skill in the art, to provide the ohmic contact 116 to the p-type layer 308.

Figure 6F:
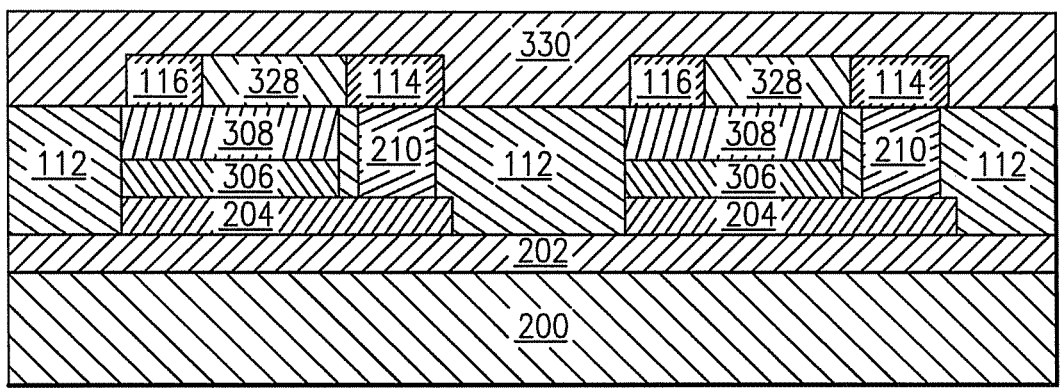
Figure 6G:
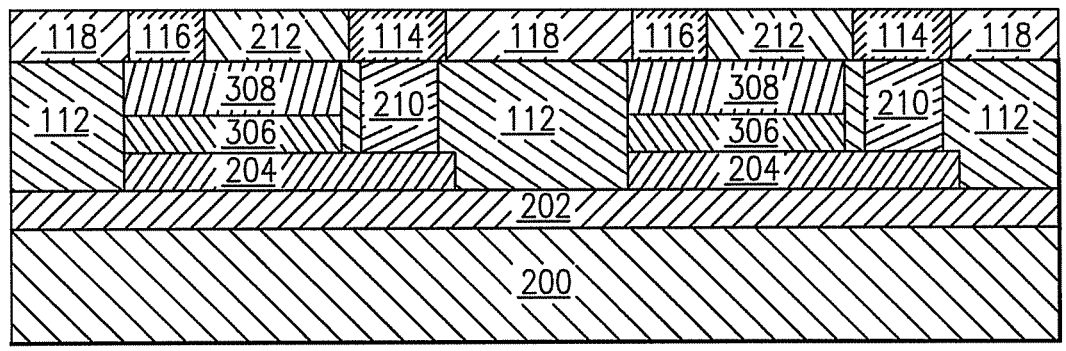

FIG. 6F illustrates formation of the interconnection 118. A sixth mask layer is formed or further patterning of the fifth mask layer 324 may be performed to provide the sixth patterned mask layer 328 having windows corresponding to the locations for the interconnection 118. The windows in the sixth patterned mask layer 328 extend to expose the ohmic contacts 114 and 116 so as to selectively electrically connect the individual devices 110 as described herein. A blanket deposition of interconnection material and, in some embodiments interconnection metal, is performed to provide the interconnection layer 330. The portions of the interconnection layer 330 that are not formed in the windows of the sixth patterned mask layer 328 are removed by, for example, CMP or other techniques known to those of skill in the art, to provide the interconnection structure 118 that selectively electrically connects the ohmic contacts 114 and 116 to provide the structure illustrated in FIG. 6G.

FIGS. 7A through 7F illustrate processing steps for fabrication of a light emitter 100 utilizing trench isolation and a via to the cathode contact, rather than the $n^+$ region 210 described above.

Figure 7A:
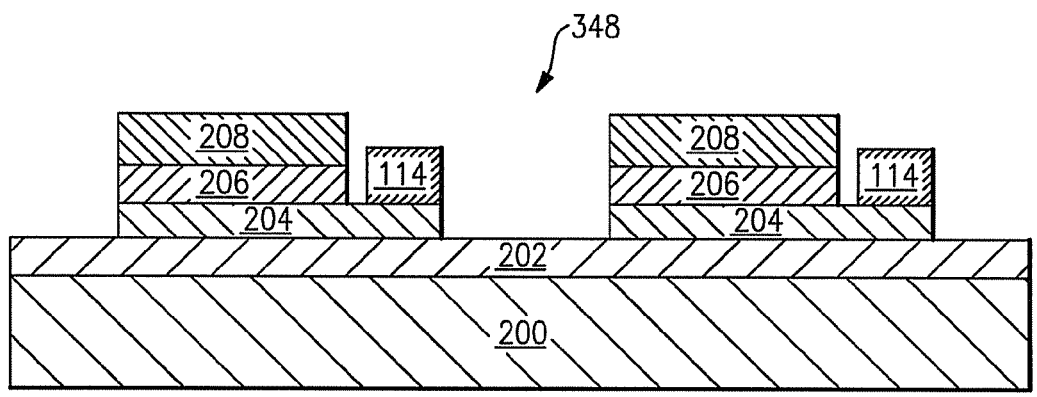
FIGS. 7A through 7F are cross-sectional illustrations illustrating fabrication of devices according to some embodiments of the present inventive subject matter.

Turning to FIG. 7A, active layers of the light emitting devices may be isolated by forming a trench 348 to define the peripheries of the individual devices. The cathode contact 114 may be formed on the n-type layer 204 at the periphery of a mesa structure that includes the quantum wells 206 and the p-type layer 208. The creation of the structure illustrated in FIG. 7A may be carried out as part of a conventional process for producing light emitting devices.

Figure 7B:
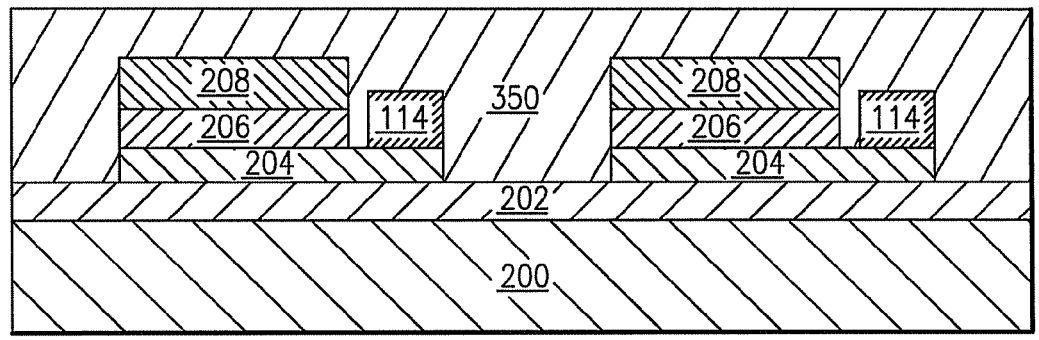

FIG. 7B illustrates the blanket deposition of one or more insulating materials 350 to fill the trench 348. Such an insulating material may be any suitable insulator compatible with the material system of the light emitting devices 110. In some embodiments, the insulator may be multiple layers, such as in an ONO or NO structure. The blanket deposited insulator 350 is planarized to expose the p-type layer 208 to provide the isolation regions 112. Such planarization may, for example, be carried out by CMP of the structure illustrated in FIG. 7B.

Figure 7C:
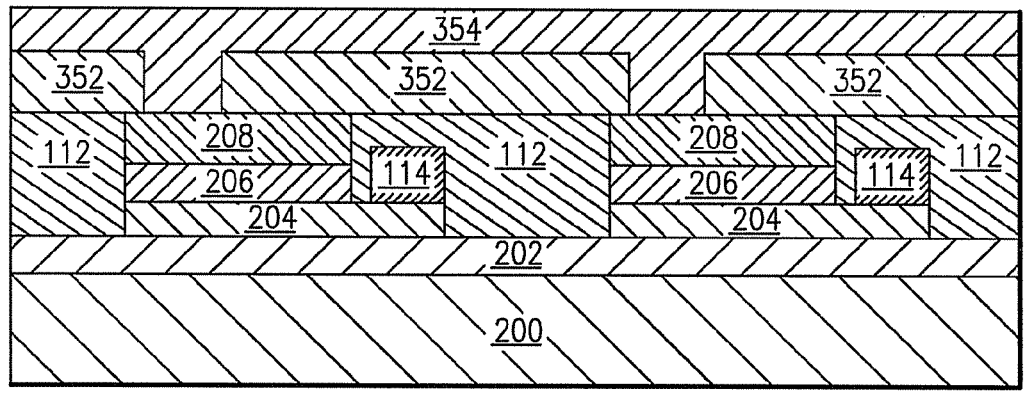

FIG. 7C illustrates the formation of a patterned mask 352 having windows corresponding to the location of the ohmic contacts on the p-type layer 208. An ohmic contact material 354 is blanket deposited on the mask 352 and into the openings so as to contact the p-type layer 208. The contact material 354 is planarized to expose the mask 352 and thereby provide the ohmic contacts 116 on the p-type layer 208. In some material systems, an anneal of the resulting structure may be performed to improve the quality of the ohmic contacts 116.

Figure 7D:
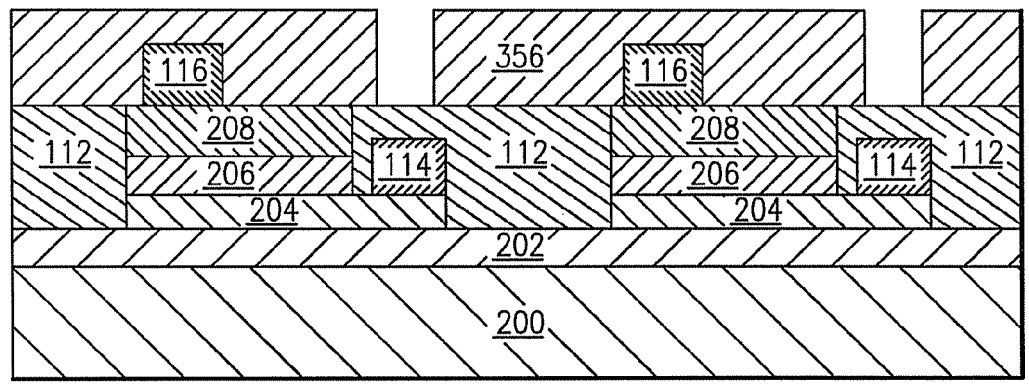

FIG. 7D illustrates the formation of a second patterned mask 356 having windows corresponding to the locations of the ohmic contact 114 to the n-type layer 204. Via openings are made to expose the ohmic contact 114, for example, by using the mask 356 as an etch mask. Other alternative techniques for opening vias to the ohmic contact 114 may also be utilized. For example, depending on the aspect ratio of the via, a lift-off technique could be used to open a via to the ohmic contact 114.

Figure 7E:
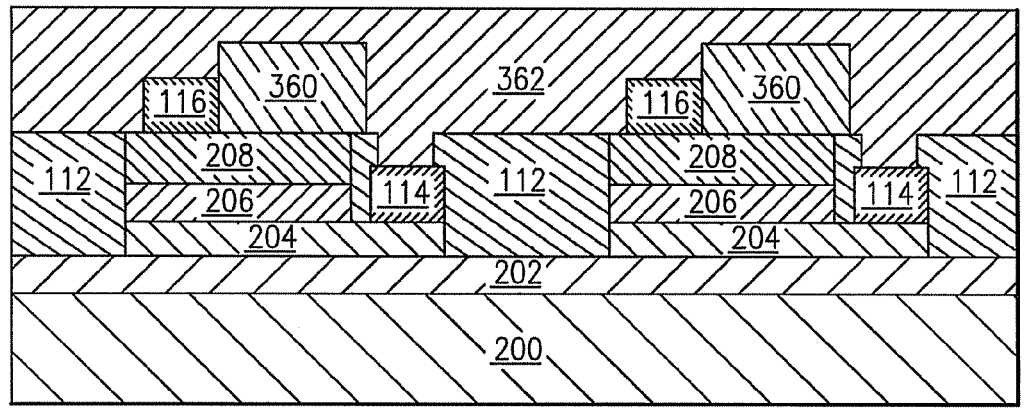
Figure 7F:
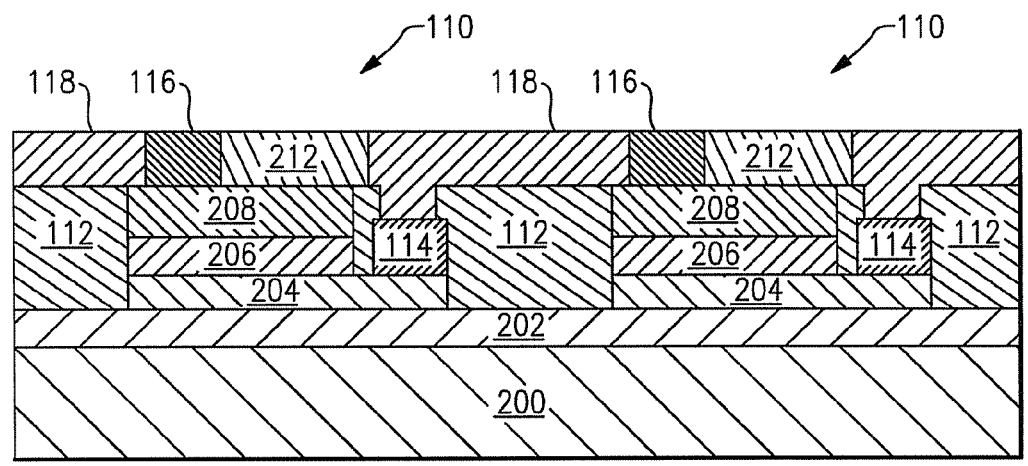

As seen in FIG. 7E, after formation of the via, the mask 356 may be re-patterned to provide windows corresponding to the interconnect structure to provide a third patterned mask 360. Alternatively, the mask 356 may be removed and a new mask formed and patterned to provide the third patterned mask 360. An interconnect electrically conductive material, such as a conductive metal, is blanket deposited on the third patterned mask 360 and the areas exposed by the windows in the third patterned mask 360. The conductive material 362 extends into the via to contact the ohmic contact 114. The conductive material 362 is planarized to at least expose the third patterned mask 360 and, in some embodiments, to expose the ohmic contact 116, resulting in the structure illustrated in FIG. 7F.

In FIG. 7E, the blanket deposition of the conductive material 362 fills the via to the ohmic contact 114. However, depending on the aspect ratio of the via, a separate step or steps may be needed to fill the via with conductive material. Such techniques for filling a via with a conductive material are known to those of skill in the art. In such a case, the blanket deposition of conductive material 362 would contact the filled via and, thereby, provide an electrical connection to the ohmic contact 114.

Figure 8A:
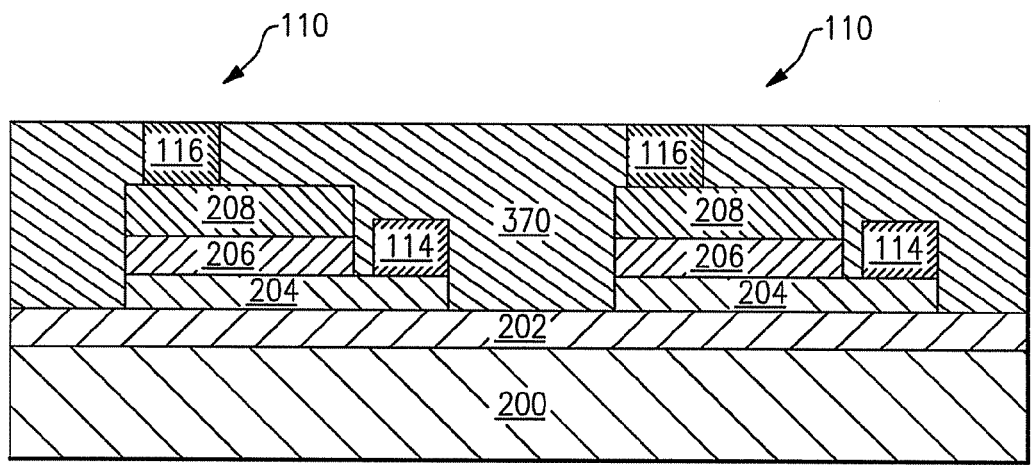
FIGS. 8A through 8D are cross-sectional illustrations illustrating fabrication of devices according to some embodiments of the present inventive subject matter.

FIGS. 8A through 8D illustrate processing steps for fabrication of a light emitter 100 utilizing a wafer of light emitting devices prior to singulation but after definition of the individual devices. As seen in FIG. 8A, the trench isolation regions between the individual devices are filled with an insulating material 370. The insulating material may be blanket deposited as one or more layers to fill the trench between the devices and then planarized to expose the ohmic contact 116. Suitable insulators have been described above, as have techniques for planarization.

Figure 8B:
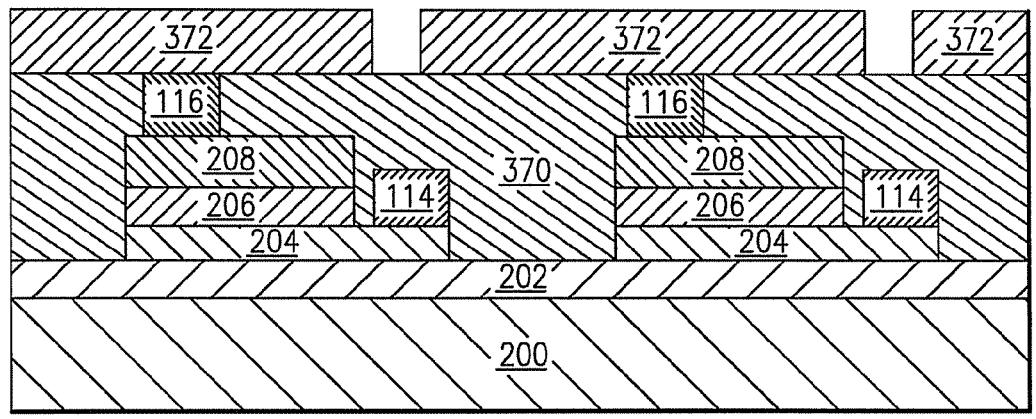
Figure 8C:
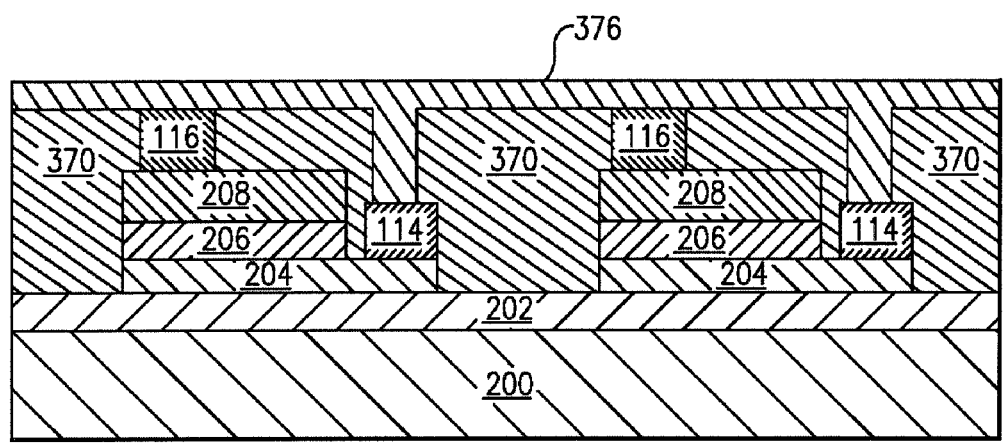
Figure 8D:
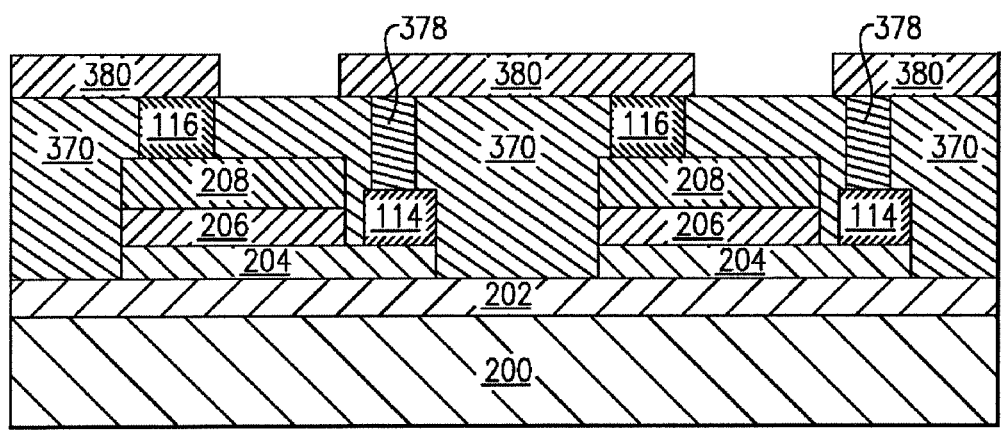

FIG. 8B illustrates the formation of a patterned mask 372 having windows corresponding to the locations of vias to the ohmic contacts 114. FIG. 8C illustrates the formation of the vias and the filling of the vias with a conductive material 376. The conductive material 376 outside of the via may be removed to expose the ohmic contact 116 and provide the conductive via 378 and provide a substantially planar surface on which to form electrical interconnections between the devices. FIG. 8D illustrates the formation and patterning of the electrical interconnection 380 to electrically connect the devices as described herein to provide the light emitter 100. Thus, using the process illustrated in FIGS. 8A through 8D, light emitters 100 may be fabricated from a conventional wafer of light emitting devices.

Figure 9:
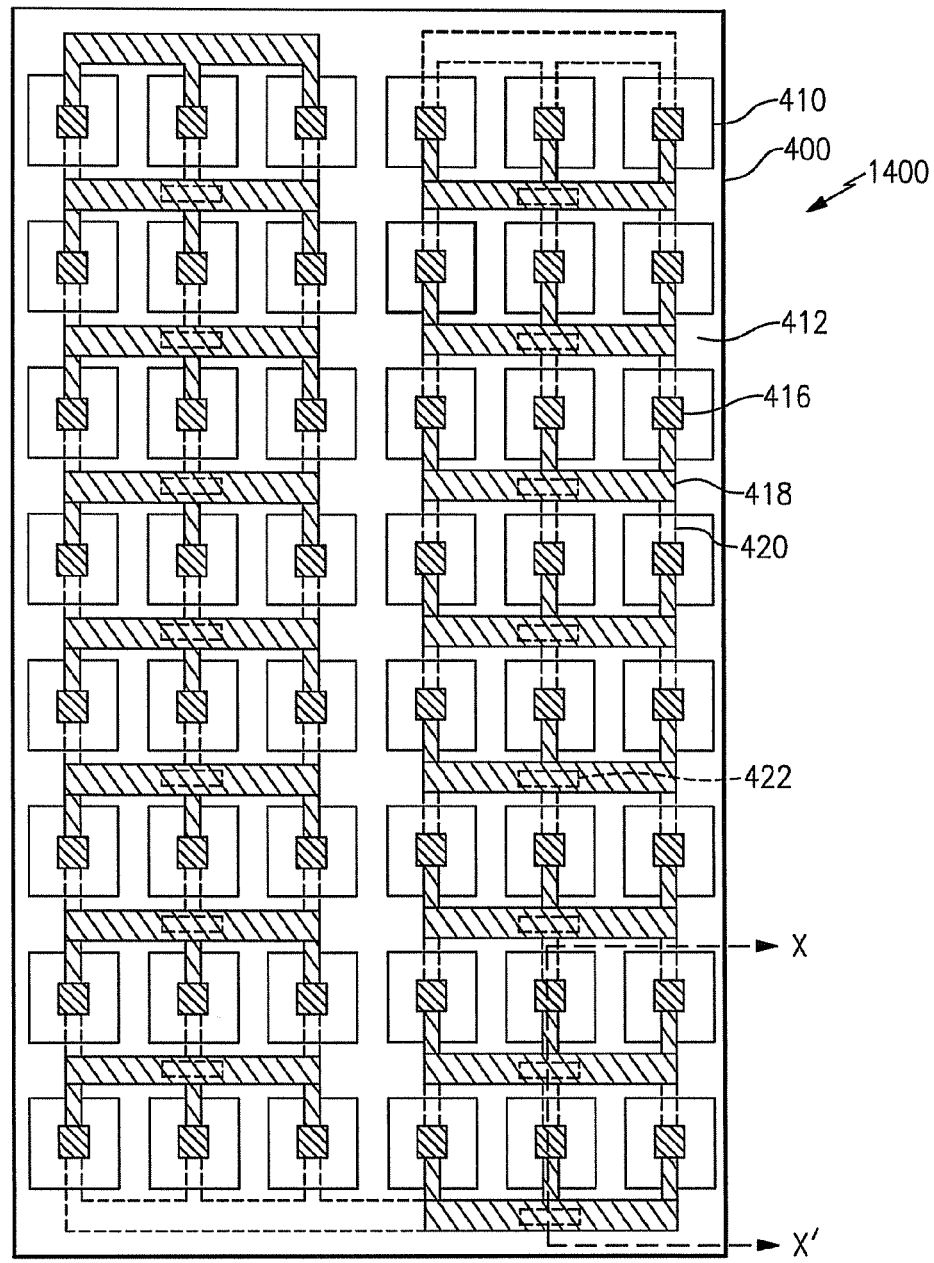
FIG. 9 is a top plan view of a light emitter according to some embodiments of the present inventive subject matter.

FIG. 9 is a top plan view of a monolithic high voltage light emitter 1400 that includes a plurality of vertical light emitting devices 410 mechanically connected by a common substrate 400. In the light emitter 1400 illustrated in FIG. 9, the light emitting devices 410 are vertical light emitting diodes each having an anode contact 416 on one side of the device and a cathode contact 414 on an opposite side of the device. Isolation regions 412 define the peripheries of individual devices 410. Topside and backside electrical interconnects 418 and 420 are connected to each other through vias 422 to provide the electrical interconnection of devices 410 as illustrated in FIG. 3.

Figure 10:
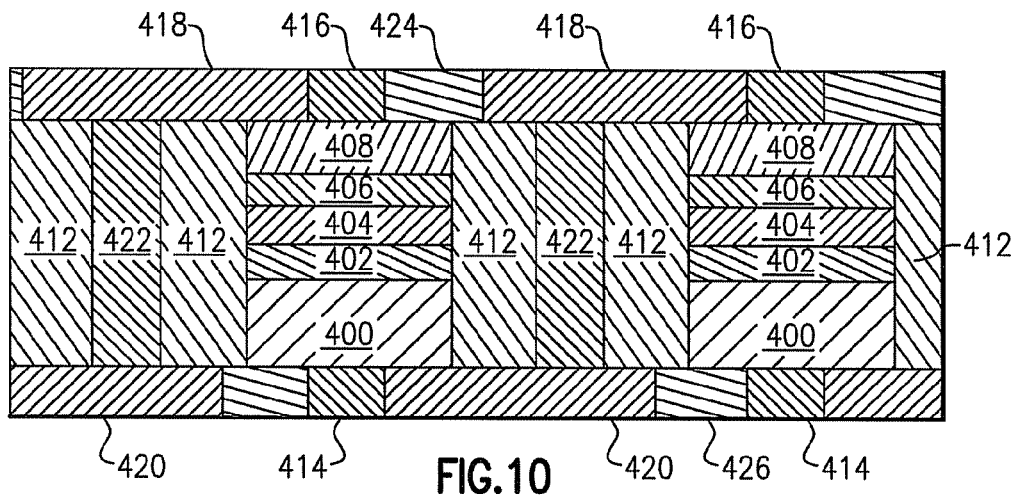
FIG. 10 is a cross-sectional illustration taken along line X-X' of FIG. 9.

FIG. 10 is a cross-sectional view of a portion of the light emitter 1400 taken along lines X-X' in FIG. 9. As seen in FIG. 9, multiple light emitting devices are provided on a common substrate 400. As discussed above, the substrate 400 may be any suitable material or combination of materials. However, in the devices of FIG. 10, the substrate is conductive. Thus, for example, the substrate may be SiC, GaN or other suitable semiconductor substrate. The particular material for the substrate 400 may depend on the light emitting device structure to be formed on the substrate. Substrates and techniques for forming light emitting devices on substrates are known to those of skill in the art.

Furthermore, in some embodiments, the substrate 400 may be removed or thinned after mounting the monolithic light emitter 1400 on another substrate to provide mechanical support for the individual devices. The substrate 400 may also be thinned, laser patterned, etched or subjected to chemical mechanical polishing (CMP). For example, light extraction features may also be provided on the substrate to improve extraction of light through the substrate as described above. In addition, the light emitting devices may also include one or more phosphors or other luminous materials. Such luminous materials may be provided on the substrate 400. For example, a YAG phosphor may be provided in a glob or conformal application on the substrate 400. In other embodiments where light extraction is not through the substrate 400, the luminous materials may be provided adjacent a surface from which light is extracted. Various luminous materials and techniques for the application of luminous materials are known to those of skill in the art.

As is further illustrated in FIG. 10, a buffer layer 402 may optionally be provided on the substrate 400. The buffer layer 402 may provide for transitions in materials, for example, to lattice-match the substrate 200 to the materials that form the active regions of the light emitting device. For example, a graded AlGaN buffer layer may be used between a SiC substrate and GaN, AlGaN, InGaN or AlInGaN active layers to improve the quality of these active layers in comparison to formation of these layers directly on the SiC substrate. The particular buffer layer material will depend on the materials of the substrate and the active layers. Buffer layers and techniques for the use of buffer layers in fabricating light emitting devices are known to those of skill in the art and need not be described further herein.

The light emitting device may also include an n-type semiconductor layer 404, one or more quantum well layers 406 and a p-type semiconductor layer 408. In a vertical device, these layers along with the conductive substrate 400 and conductive buffer layer 402 are collectively referred to as the "active layers" of the device. The particular structure, materials and configuration of the active layers may be any suitable structure, materials or configuration that is capable of producing light when a current passes between the p-type layer and the n-type layer. Various structures, materials and configurations for the active layers of a vertical light emitting device are known to those of skill in the art. Any suitable structures, materials and configurations for the active layers may be utilized in embodiments of the present inventive subject matter as long as such structures, materials and configurations allow for the electrical interconnection of individual devices on the substrate 400 as described herein with reference to the exemplary structures, materials and configurations. In particular embodiments, the structure, materials and configuration may allow for the electrical interconnection of light emitting devices which are on a contiguous region of a wafer.

The individual light emitting devices 410 of the light emitter 1400 are defined by isolation regions 412. The isolation regions 412 may, in some embodiments, be provided by ion implantation to create insulating or semi-insulating regions that extend through the active layers as illustrated in FIG. 10. Alternatively or additionally, one or more trenches could be formed between the light emitting devices 410. The trenches could, optionally, be filled with an insulator, such as $SiO_x$ or SiN, to provide a more planar surface on which the electrical interconnect 418 and/or 420 is provided. Combinations of trenches and implantation could also be provided. For example, a trench could be formed and then ions implanted into the sidewalls and/or bottom of the trench to make these regions insulating or semi-insulating.

An n-type contact 414 on the substrate 400 provides a cathode contact for each die and a p-type contact 416 provides an anode contact for each die. The particular configuration and composition of the n-type and p-type contacts 414 and 416 can be selected based on the material system of the lighting device. Techniques for fabricating n-type and p-type ohmic contacts in differing materials systems are well known to those of skill in the art. Embodiments of the present inventive subject matter may be utilized with any type of ohmic contact that is capable of being electrically interconnected to ohmic contacts of other light emitting devices on the wafer.

FIG. 10 also illustrates optional insulating layers 424 and/or 426 that may be provided on exposed portions of the devices and/or between devices. The insulating layers 424 and/or 426 may function as protective and/or passivation layers for the devices. Such layers may be the result of the fabrication of the interconnection or may be provided as a separate layer after fabrication of the remainder of the device. Additionally, multiple layers may also be provided, for example, an Oxide-Nitride-Oxide (ONO) or Nitride-Oxide (NO) structure may be utilized.

As is further seen in FIG. 10, a conductive via 422 extends through the structure and connects the conductive die interconnections 418 and 420 formed on the opposing sides of the structure. The via 422 allows for the connection of anodes of a subsequent subset of devices to the cathodes of the previous subset of devices to provide the "series of parallel-connected subsets" array of devices illustrated in FIG. 3. Additionally, a via may also have the added benefit of conducting heat to an exterior surface of the device, thereby facilitating heat extraction from the junction region of the device.

Figure 11A:
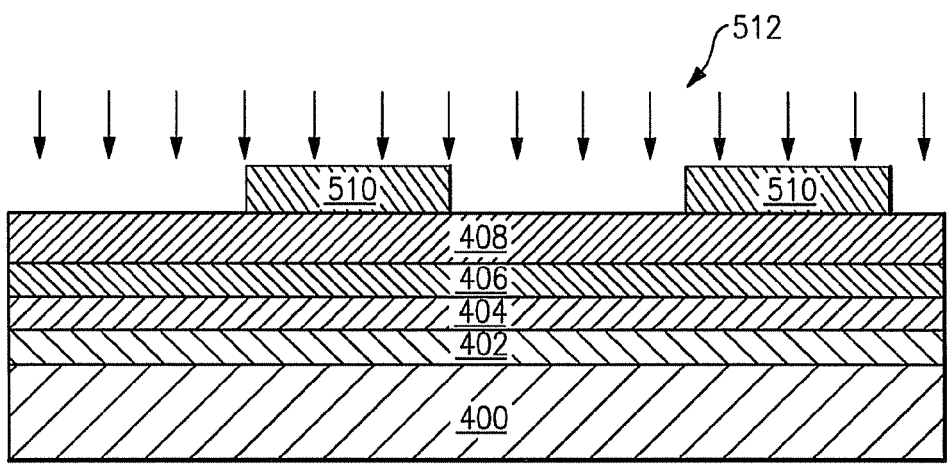
FIGS. 11A through 11G are cross-sectional illustrations illustrating fabrication of devices according to some embodiments of the present inventive subject matter.

FIGS. 11A through 11G illustrate processing steps for the fabrication of lighting devices 1400 according to exemplary embodiments of the present inventive subject matter. As seen in FIG. 11A, a wafer with conventional layers for forming a light emitting diode may have a patterned mask 510 formed on an upper surface of the wafer. The patterned mask 510 defines the regions of the wafer for forming light emitting diodes with windows in the pattern mask corresponding to the isolation regions of the lighting device 1400. Ion implantation is performed by implanting ions 512 through the patterned mask 510 to create insulating or semi-insulating isolation regions 412 in the structure of FIG. 11A. While the ion implantation is illustrated as being from a top side of the wafer, additionally or alternatively, ion implantation with a corresponding mask could be performed from the bottom or substrate side of the wafer as well. Furthermore, a trench could be provided on one side of the wafer, for example, by utilizing the mask 510 as an etch mask, and then ion implantation performed using the same etch mask to provide a self-aligned trench and implanted region that, together, provide the isolation region 412. The trench could also be filled with an insulator as described above to provide a more planar device surface for subsequent fabrication processes.

Figure 11B:
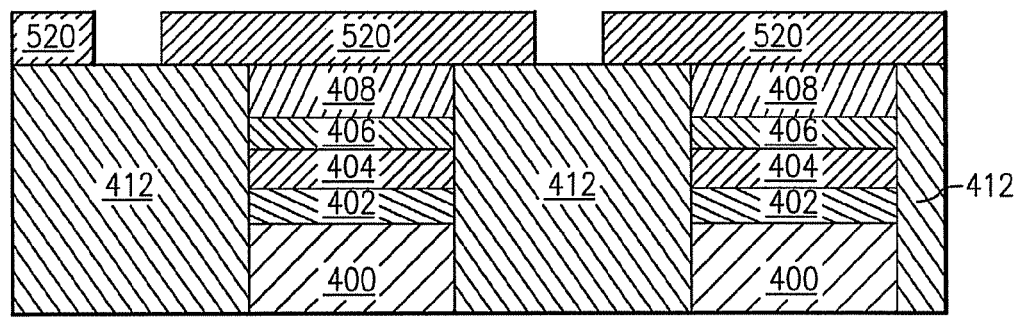

However the isolation region 412 is provided, as seen in FIG. 11B, a second mask layer 520 may be provided, the windows of which define vias through the isolation region 412. Utilizing the second mask layer 520, a via hole may be etched through the isolation region to extend through the device. The via hole is filled with conductive material, such as a metal, to provide a conductive via 422 through the device.

Figure 11C:
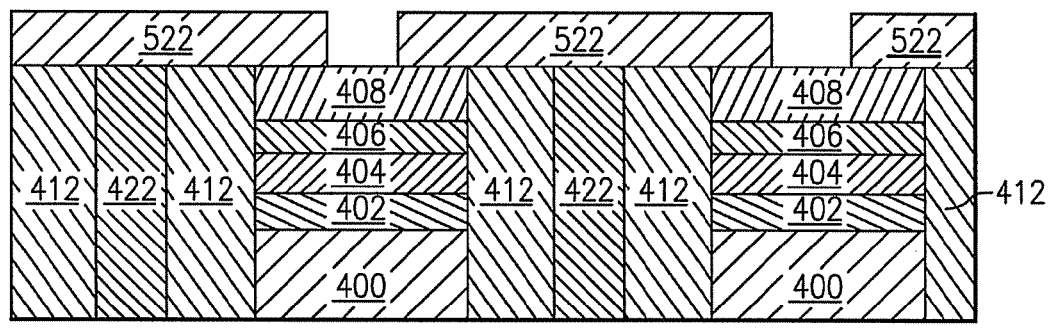
Figure 11D:
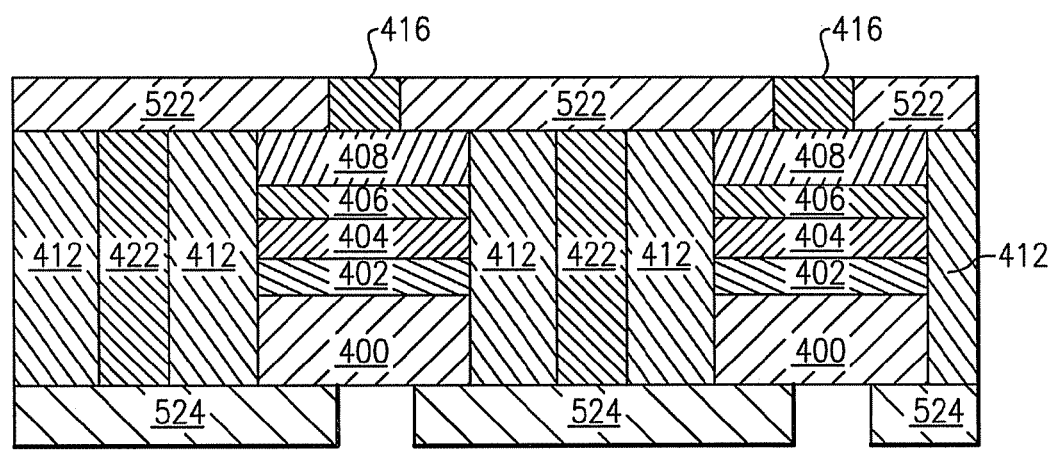
Figure 11E:
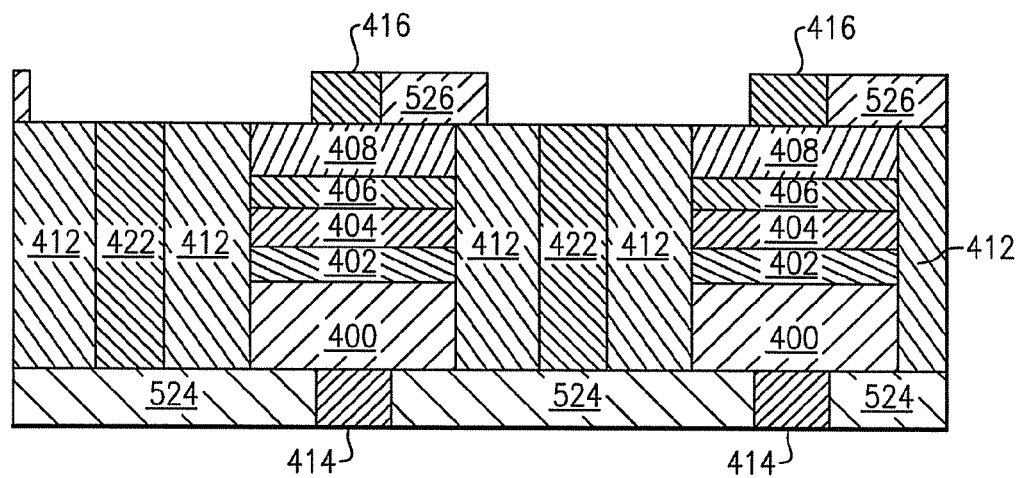
Figure 11F:
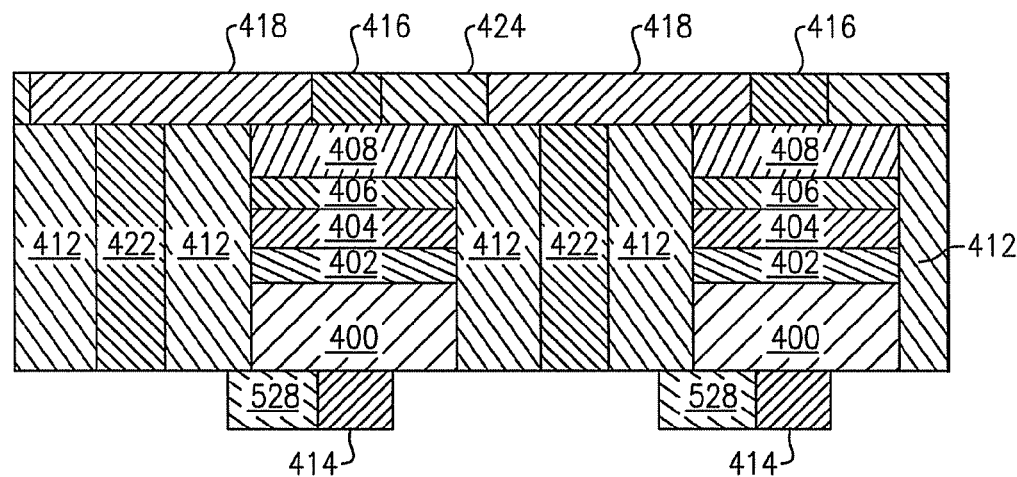
Figure 11G:
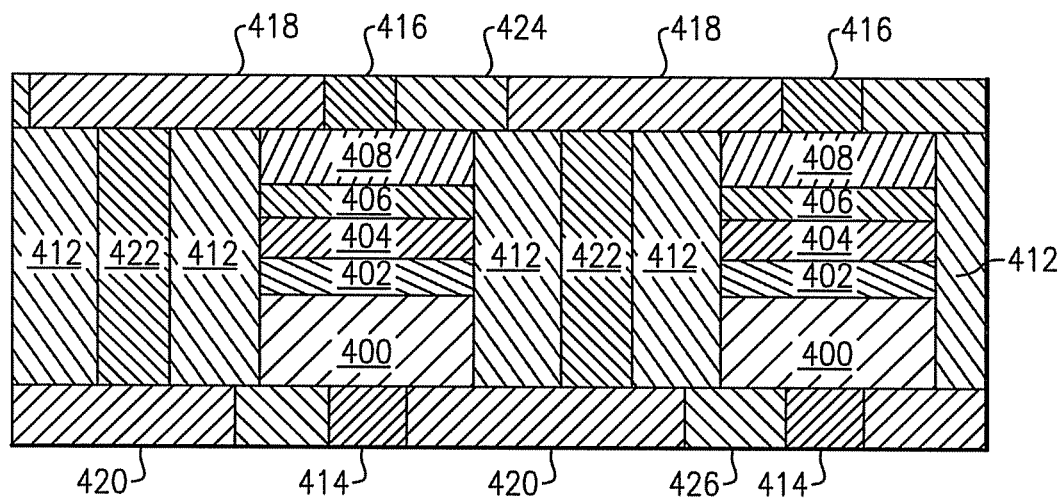

FIG. 11C illustrates the formation of the ohmic contact 416 to the p-type layer 408 by forming a third patterned mask 522 having windows corresponding to the locations of the ohmic contact 416. Contact material is deposited in and patterned using the mask layer 522. Similarly, FIG. 11D illustrates formation of the ohmic contact 414 on the substrate side of the device utilizing a fourth patterned mask 524.

FIGS. 11 E and F illustrate formation of the device interconnections 418, 420 on the front and back sides of the wafer. Thus, mask layers 526 and 528 are provided on opposite sides of the wafer and conductive material, such as a conductive metal, is deposited and patterned using the respective mask layers. Fabrication of the conductive interconnect regions 418 and 420 then results in the structure illustrated in FIG. 11G.

The processing steps of FIG. 6A through 6G, 7A through 7F, 8A through 8D and 11A through 11G need not be carried out in the described order but may be carried out in any suitable order. For example, with respect to FIGS. 6A through 6G, if a high temperature anneal is required to produce the n⁺ contact region 210, then it may be advantageous to perform the implant of the n⁺ contact region 210 prior to creating the isolation region 112 so that the anneal does not repair the crystal structure in the isolation region 112. Similarly, if the formation of an ohmic contact to the p-type layer 208 requires an anneal, the ohmic contact 116 may be formed prior to implantation of the isolation region 112. Thus, the sequence and particular processing steps utilized to provide the structures illustrated in the Figures may be selected depending on the characteristics of the material system and the structure of the light emitting devices. Such variations are within the scope of the present inventive subject matter.

Also, while embodiments of the present inventive subject matter have been described with reference to using a mask layer, depositing a material on the mask and then using a lift-off or planarization technique to remove the undesired material, the present inventive subject matter should not be construed as limited to such techniques. For example, in alternative embodiments, a mask may be provided on a layer of material and the mask corresponding to the regions to be retained and windows corresponding to regions to remove. The unwanted material could then be removed, for example, by etching or other techniques known to those of skill in the art.

Figure 12:
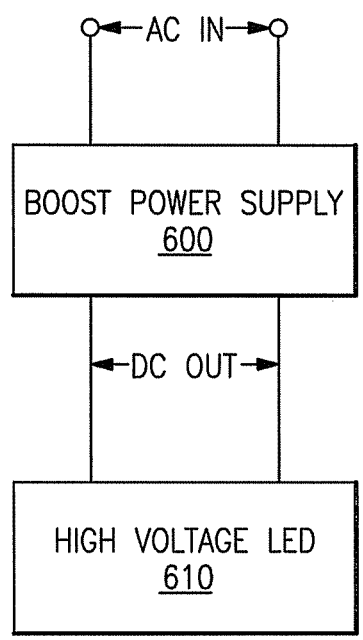
FIG. 12 is a block diagram of a lighting system incorporating light emitters according to some embodiments of the present inventive subject matter.

Systems incorporating embodiments of the present inventive subject matter will now be described with reference to FIG. 12. As seen in FIG. 12, a high voltage LED 610 as described above may be driven by a boost power supply 600. The boost power supply 600 may receive an alternating current (AC) input, such as an AC power line of 100, 120, 220, 230 or 277 volts RMS, and it converts that AC voltage to a direct current (DC) voltage having a higher value than the peak voltage of the AC input voltage. Boost power supply configurations are known to those of skill in the art.

Boost power supplies may be highly efficient. Furthermore, as discussed above, by providing a high voltage light emitter, $I^2R$ losses may be reduced because the current through the light emitter may be reduced in comparison to corresponding lower voltage light emitters. Combining the high voltage light emitter as described herein with a boost power supply may provide very high system efficacies. Thus, in some embodiments of the present inventive subject matter, the high voltage light emitters are provided to operate at a voltage of at least 50 volts, at least 150 volts, at least 325 volts or at least 395 volts. The operating voltage of the high voltage light emitter may be controlled by the forward voltage drop of the individual devices and the number of subsets of parallel-connected devices that are connected in series. Thus, for example, if a 90 volt device is desired, 30 subsets of devices, each with a $V_f$ of 3 volts, could be connected in series.

Representative examples of circuits which include a boost component are described in U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007 (now U.S. Patent Publication No. 2008/0088248), the entireties of which are hereby incorporated by reference.

As discussed above, by connecting subsets of parallel-connected devices in series, device yield may be increased because a failed light emitting device would not necessarily result in failed light emitter. Additionally, the higher the voltage of the monolithic device, the less likely that a short circuit of a die will make the overall light emitter unusable. For example, if a 300V light emitter is being fabricated from a serial connection of 100 subsets of parallel-connected devices and one of the devices short circuits, then the light emitter will have a voltage drop of 297V or 97% of the desired voltage. In contrast, if a 30V device is fabricated from the serial connection of 10 subsets of devices, failure of one device as a short circuit would result in a 27V device, or a change of 10%. Accordingly, for a given forward voltage, higher voltage monolithic light emitters may be more tolerant of individual faults in the devices of the light emitter.

Additionally, the number of devices within a subset may be balanced against the likelihood of short circuit failure. The more devices that are connected in parallel, the higher percentage of the total number of devices that will be lost in the event of a short circuit. However, the more devices that are connected in parallel, the more devices that can have an open circuit fault without raising the current through an individual device to an unacceptable level. In any event, at least three light emitting devices should be connected in parallel, so that the current through remaining devices in the event of an open circuit fault will not increase to levels that could substantially shorten the life of the remaining light emitting devices in the subset (which could otherwise start a spiral of failure).

Because a short circuit would result in the bypass of a subset of devices, in some embodiments of the present inventive subject matter a short circuit tolerant device could be provided. For example, when a light emitting device short-circuits, substantially all of the current that flows through the device flows through the shorted device. Thus, a fuse link or other such device could be incorporated in series with each device so that if the total current through the device (at least 3 times the normal current that would be expected to flow through the die) flows through the die, the link opens. Thus, the current would transfer back to the remaining devices in the subset and the short circuit would be "healed." This process could continue until one of only two remaining functioning light emitting devices in a subset failed, in which case both fuses would open and the entire light emitter would fail. Fuses could be incorporated, for example, between the anode of a device and the interconnection metallization that forms a subset of devices.

In addition to self-healing devices as described above, yield could also be improved by measuring devices during the manufacturing process to detect short-circuited devices. These devices could then not be connected to the other devices in the subset. For example, the anode or cathode contact of the short-circuited device could be etched from the device using a stepper mask which would prevent the device from becoming part of the total device.

While embodiments of the present inventive subject matter have been described with reference to interconnections being formed on the wafer, other interconnection techniques for electrically interconnecting devices that are mechanically connected by a common substrate may also be utilized. For example, the submount described in commonly assigned and concurrently filed U.S. Patent Application Ser. No. 60/986,795 entitled ILLUMINATION DEVICES USING EXTERNALLY INTERCONNECTED ARRAYS OF LIGHT EMITTING DEVICES, AND METHODS OF FABRICATING SAME, filed Nov. 9, 2007 (Inventors: Gerald H. Negley and Antony Paul van de Ven), the disclosure of which is incorporated herein by reference as if set forth in its entirety, could be utilized.

Additionally, embodiments of the present inventive subject matter may be particularly well suited to providing light emitters as described in U.S. Pat. No. 7,213,940, the disclosure of which is incorporated herein by reference as if set forth in its entirety. In embodiments incorporating a luminous material, light emitters according to the present inventive subject matter may provide light emitters as described in U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference as if set forth in its entirety.

While inventive aspects have been described above primarily with reference to monolithic devices for operation with DC power sources, additional inventive aspects may provide monolithic devices suitable for operation with AC and/or DC power sources. Examples of such devices are illustrated in FIGS. 13 and 14.

Figure 13:
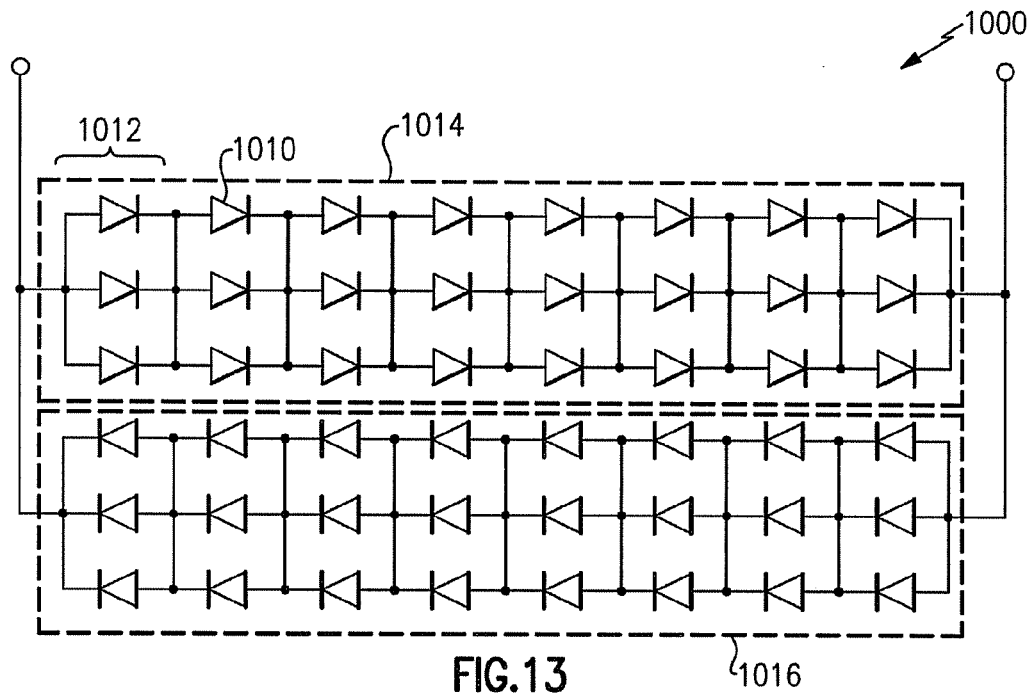
FIG. 13 is a schematic drawing of a lighting system according to some embodiments of the present inventive subject matter.

FIG. 13 illustrates an AC monolithic device 1000. The AC monolithic device 1000 includes a plurality of light emitting diodes 1010 provided as two or more arrays 1014, 1016 of serially connected subsets 1012 of parallel connected light emitting diodes 1010. The diodes 1010 may be interconnected as described elsewhere herein. The diodes 1010 may have a common substrate and/or be formed from a common n-type or p-type layer. The arrays 1014 and 1016 may be electrically arranged in an anti-parallel relationship such that when an alternating current (AC) power source is applied to the two arrays 1014, 1016, substantially all of the current flows through only one of the arrays on alternating cycles of the AC input. Thus, the monolithic device 1000 may be suitable for use as an AC device. The expression "anti-parallel", as used herein, refers to circuitry in which arrays of diodes are arranged in parallel, with the diodes in at least one array being oriented (biased) in a direction which is opposite to the direction of orientation (bias) of the diodes in at least one other array (as shown in the circuit depicted in FIG. 13).

The monolithic device 1000 may be made using any of the fabrication techniques described herein that are capable of providing the interconnections illustrated in FIG. 13. The number of serially connected subsets 1012 of light emitting diodes 1010 may be selected based on the desired operating voltage. Also, the number of light emitting diodes 1010 that are connected in parallel may be selected as described above and should include at least three parallel connected devices.

Figure 14:
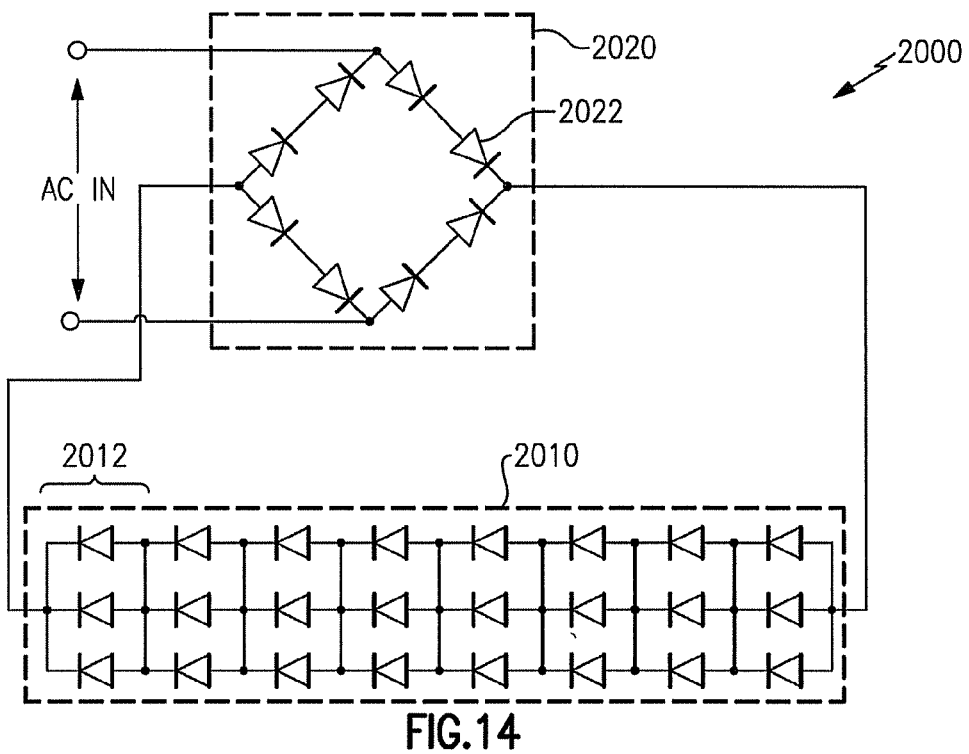
FIG. 14 is a schematic drawing of a lighting system according to some embodiments of the present inventive subject matter.

FIG. 14 illustrates a monolithic device 2000 that may receive an AC or DC input. In particular, the monolithic device 2000 includes a rectifying bridge 2020 and one or more arrays 2010 of serially connected subsets 2012 of parallel connected light emitting devices. The rectifying bridge 2020 may be constructed of light emitting devices 2022. The light emitting devices 2022 may be formed on a common substrate, from a common n-type or p-type layer or from a common material system, such as SiC, GaN, etc., as the light emitting devices in the array 2010. The diodes 2022 may also be non-light emitting. The number of diodes 2022 in each leg of the bridge 2020 depends on the reverse breakdown characteristics of the diodes and should be sufficient to support the reverse voltage from alternating cycles of the AC input. While the diodes 2022 are shown as two diodes serially connected, other numbers of diodes may be utilized. Furthermore, the diodes 2022 of the bridge 2020 may be provided as serially connected subsets of parallel connected diodes as described herein.

The output of the bridge 2020 is a full wave rectified voltage that is provided to the array 2010. As described above, the number of serially connected devices in the array 2010 may be selected based on the operating voltage provided by the bridge 2020.

The monolithic device 2000 may be provided using any suitable fabrication and interconnection technique as described above. Furthermore, while the monolithic device is illustrated in FIG. 14 with an AC input, a DC input could be applied to the device.

While embodiments of the present inventive subject matter have been described with reference to particular techniques and/or processes for the interconnection of multiple devices on a common substrate, other techniques may also be utilized. For example, techniques from microelectronic fabrication for interconnection of devices on a common substrate, such as interconnection techniques used in the fabrication of memory devices, may be utilized. Accordingly, some embodiments of the present inventive subject matter should not be construed as limited to the particular techniques and/or processes for the interconnection of multiple devices.

In some embodiments of the present inventive subject matter, an insulating layer(s) may be blanket deposited on all of the devices and regions between devices of the monolithic light emitter. Vias may be patterned and filled to connect to contacts of the individual devices. Interconnections between the vias may be provided, for example, using a damascene process where trenches are formed in the insulating layer followed by a blanket deposition of interconnection metal. A planarization, such as by CMP, may then be performed to remove interconnect metal that is not in the trenches, thereby creating a desired interconnection pattern on the wafer or portion thereof containing the devices of the light emitter.

The light emitters of the present inventive subject matter can be supplied with electricity in any desired manner. Skilled artisans are familiar with a wide variety of power supplying apparatuses, and any such apparatuses can be employed in connection with the present inventive subject matter. The light emitters of the present inventive subject matter can be electrically connected (or selectively connected) to any desired power source, persons of skill in the art being familiar with a variety of such power sources.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, and it may also encompass combinations of elements of the various illustrated embodiments.

For example, embodiments have been described herein in which each of the serially connected subsets of light emitting devices contains the same number of light emitting devices (for example, in the embodiment depicted in FIG. 3, and other embodiments depicted herein, each of the subsets contains three light emitting devices), but the present inventive subject matter is not limited to light emitters in which such is the case. In other words, the present inventive subject matter encompasses light emitters in which each of the subsets have the same number of light emitting devices as well as light emitters in which at least one (or more) of the subsets has a number of light emitting devices which differs from the number of light emitting devices in at least one other subset. In addition, respective light emitting devices within a single subset and/or in different subsets can be of the same or substantially the same size, or can be of differing sizes. In light emitters in which a first subset is connected in series with a second subset and the first and second subsets have different respective numbers of light emitting devices, in some embodiments according to the present inventive subject matter, the current density passing through the first and second subsets is the same or substantially the same, e.g., by selecting the respective light emitting devices to be of differing sizes.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the devices described herein can be integrated. Any structural part of the devices described herein can be provided in two or more parts (which are held together, if necessary). Similarly, any two or more functions can be conducted simultaneously, and/or any function can be conducted in a series of steps.

That which is claimed is:

1. A light emitter, comprising:
a plurality of light emitting devices mechanically interconnected by a common substrate on which the light emitting devices are formed; and
a plurality of fuse links,
wherein:
the light emitting devices are electrically interconnected on the common substrate to provide an array of at least two serially connected subsets of parallel connected light emitting devices, each subset comprising at least three light emitting devices, the light emitter comprising at least first and second subsets of light emitting devices, the first subset comprising at least first, second and third light emitting devices, the second subset comprising at least fourth, fifth and sixth light emitting devices, and
a first fuse link electrically connected in series with the first light emitting device, the second fuse link electrically connected in series with the second light emitting device, the third fuse link electrically connected in series with the third light emitting device, the fourth fuse link electrically connected in series with the fourth light emitting device, the fifth fuse link electrically connected in series with the fifth light emitting device, the sixth fuse link electrically connected in series with the sixth light emitting device.

2. A method of fabricating a light emitter, comprising:
forming a plurality of light emitting devices on a substrate, the plurality of light emitting devices comprising at least first and second light emitting devices;
electrically connecting the light emitting devices on the substrate to provide an array of at least two serially connected subsets of parallel connected light emitting devices, each subset comprising at least three light emitting devices; and
connecting at least a first fuse link in series with the first light emitting device and at least a second fuse link in series with the second light emitting device and electrically in parallel with the first fuse link.

3. A light emitter, comprising:
a plurality of light emitting devices mechanically interconnected by a common substrate on which the light emitting devices are formed;
wherein:
the plurality of light emitting devices comprises at least a first n-type layer and at least a first p-type layer,
at least some of the light emitting devices are electrically interconnected on the common substrate by at least a first interconnect portion to provide an array of at least two serially connected subsets of parallel connected light emitting devices, each subset comprising at least three light emitting devices,
the plurality of light emitting devices comprises at least first and second light emitting devices,
the first light emitting device comprises a first region of the first n-type layer,
the first light emitting device comprises a first region of the first p-type layer,
the second light emitting device comprises a second region of the first n-type layer,
the second light emitting device comprises a second region of the first p-type layer,
the first light emitting device and the second light emitting device are isolated from one another by at least a first insulating region,
the first interconnect portion is electrically connected to at least one of (1) the first region of the first n-type layer and (2) the first region of the first p-type layer by a first via,
the first via extends through at least a portion of the first insulating region.

* * * * *